(12) United States Patent
Kim

(10) Patent No.: US 11,258,435 B2
(45) Date of Patent: Feb. 22, 2022

(54) OUTPUT DRIVING CIRCUIT

(71) Applicant: SK hynix Inc., Icheon (KR)

(72) Inventor: Gyu Nam Kim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/073,964

(22) Filed: Oct. 19, 2020

(65) Prior Publication Data

US 2021/0367586 A1 Nov. 25, 2021

(30) Foreign Application Priority Data

May 19, 2020 (KR) ................ 10-2020-0060001

(51) Int. Cl.
H03K 3/00 (2006.01)
H03K 3/356 (2006.01)
H03K 19/003 (2006.01)

(52) U.S. Cl.
CPC . H03K 3/356113 (2013.01); H03K 19/00315 (2013.01)

(58) Field of Classification Search
CPC .............. H03K 3/356113; H03K 19/00315
USPC ..................................................... 327/108
See application file for complete search history.

(56) References Cited

U.S. PATENT DOCUMENTS

| | | | |
|---|---|---|---|
| 5,736,869 A | 4/1998 | Wei | |
| 7,005,913 B2 | 2/2006 | Diffenderfer | |
| 7,205,819 B2 | 4/2007 | Davis | |
| 8,212,590 B2 | 7/2012 | Wang et al. | |
| 8,994,412 B2 * | 3/2015 | Kim ............... | H03K 19/018521 327/109 |
| 9,893,517 B2 | 2/2018 | Dey et al. | |
| 10,027,325 B1 | 7/2018 | Graves | |
| 10,305,474 B2 | 5/2019 | Lee | |
| 10,348,301 B2 * | 7/2019 | Lee ................. | H03K 19/0005 |
| 10,511,304 B2 * | 12/2019 | Pan ................. | H03K 19/018585 |
| 10,659,047 B2 * | 5/2020 | Lee ................. | H03K 19/17788 |
| 10,848,154 B2 | 11/2020 | Lee | |
| 2010/0176848 A1 * | 7/2010 | Du .................. | G11C 7/1057 327/108 |
| 2010/0271118 A1 * | 10/2010 | Bhattacharya ..... | H03K 17/0822 327/543 |
| 2011/0025380 A1 * | 2/2011 | Kim ............... | H03K 3/356113 327/108 |
| 2018/0316185 A1 | 11/2018 | Lai et al. | |

FOREIGN PATENT DOCUMENTS

KR 20180128600 A 12/2018

OTHER PUBLICATIONS

K. Rajagopal et al., "Dynamically Biased Low Power High Performance 3.3V Output Buffer in a Single Well Bulk CMOS 1.8V Oxide 45nm Process," Published in: 13th International Symposium on Quality Electronic Design, Mar. 19-21, 2012, pp. 159-164.

(Continued)

*Primary Examiner* — Ryan Jager

(57) ABSTRACT

An output driving circuit includes a pull-down driver and a voltage stabilizer. The pull-down driver includes first, second, and third transistors connected in series between a pad and a ground node. The voltage stabilizer generates a stabilization voltage based on a voltage of the pad and a power voltage, and outputs the stabilization voltage to a control terminal of the second transistor.

19 Claims, 34 Drawing Sheets

(56) References Cited

OTHER PUBLICATIONS

K. Rajagopal et al., "An Enhanced Topology for Reliability of a High Performance 3.3V I/O Buffer in a Single-well Bulk CMOS 1.8v-oxide Low voltage Process," Published in: 2009 10th International Symposium on Quality Electronic Design, Mar. 16-18, 2009, pp. 103-106.
Marcus Ng, "3.3V Transmitter Using 1.8V Transistors In A Cascode Configuration," Theses and dissertations. Paper 2056. Ryerson University. Jan. 1, 2013, pp. 1-48, http://digitalcommons.ryerson.ca/dissertations.
V. Kumar et al., "Power Sequence free 400Mbps 90pW 6000μm2 1 8V-3.3V Stress Tolerant I/O Buffer in 28nm CMOS," Published in: 2013 Proceedings of the ESSCIRC, Sep. 16-20, 2013, pp. 37-40.
Office Action dated Apr. 14, 2021 for related U.S. Appl. No. 17/076,474.
Office Action dated Aug. 9, 2021 for U.S. Appl. No. 17/076,474.

* cited by examiner

<PRIOR ART>

<PRIOR ART>

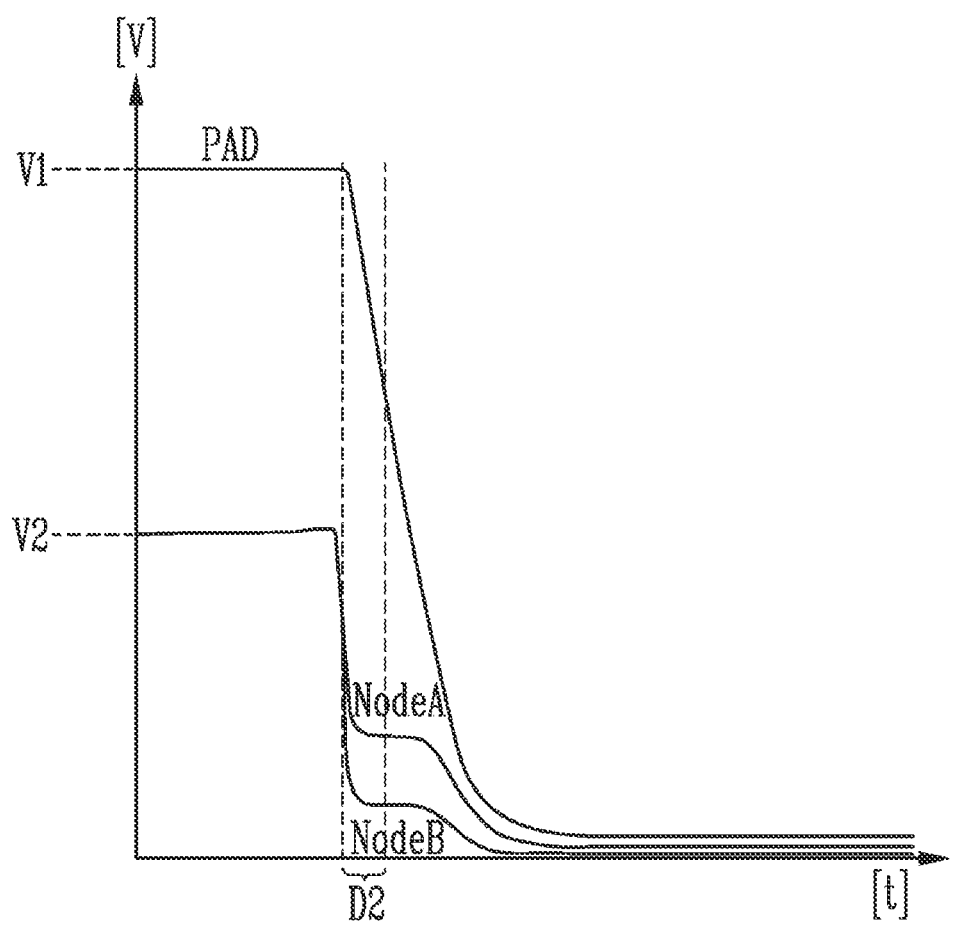

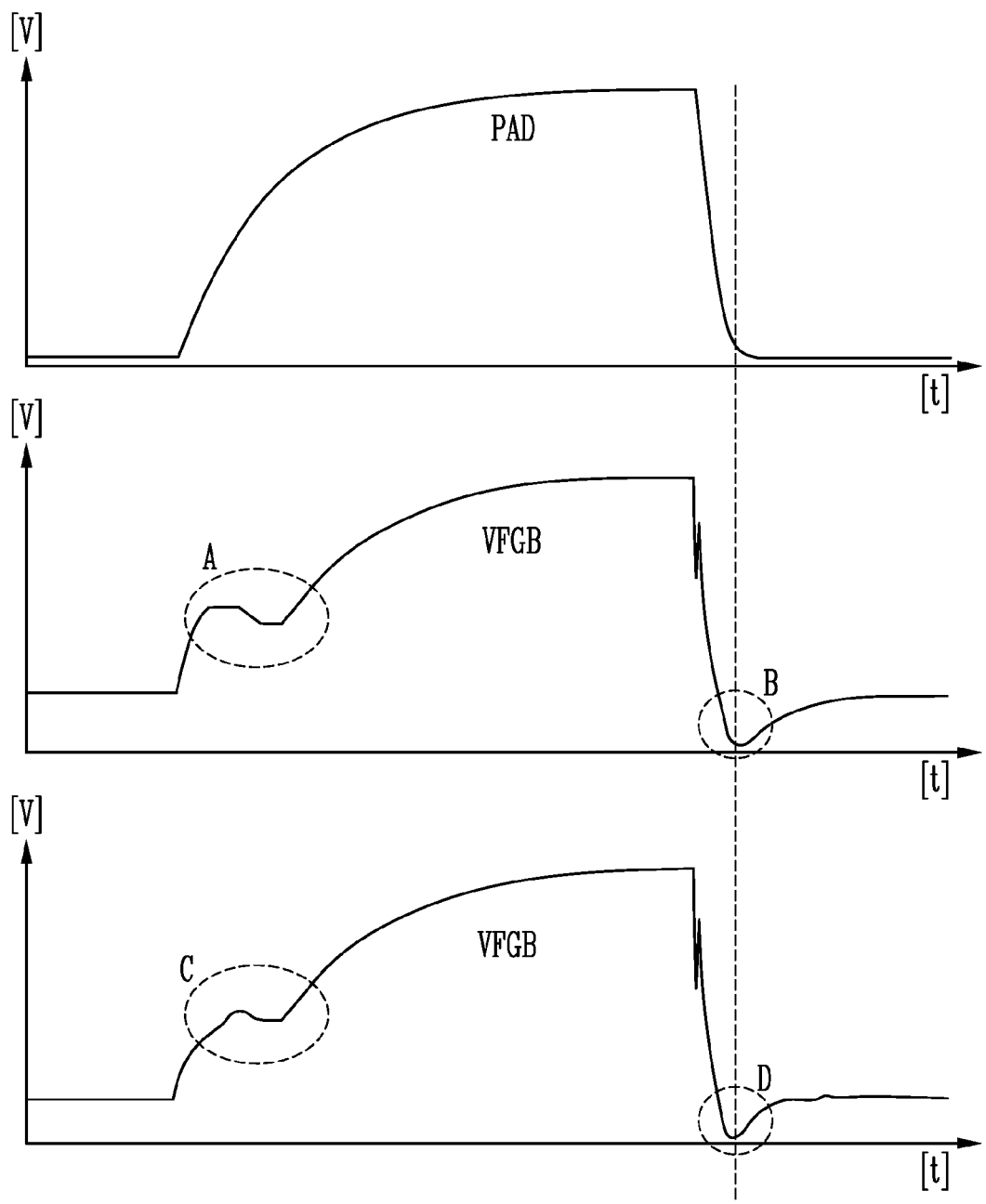

FIG. 17
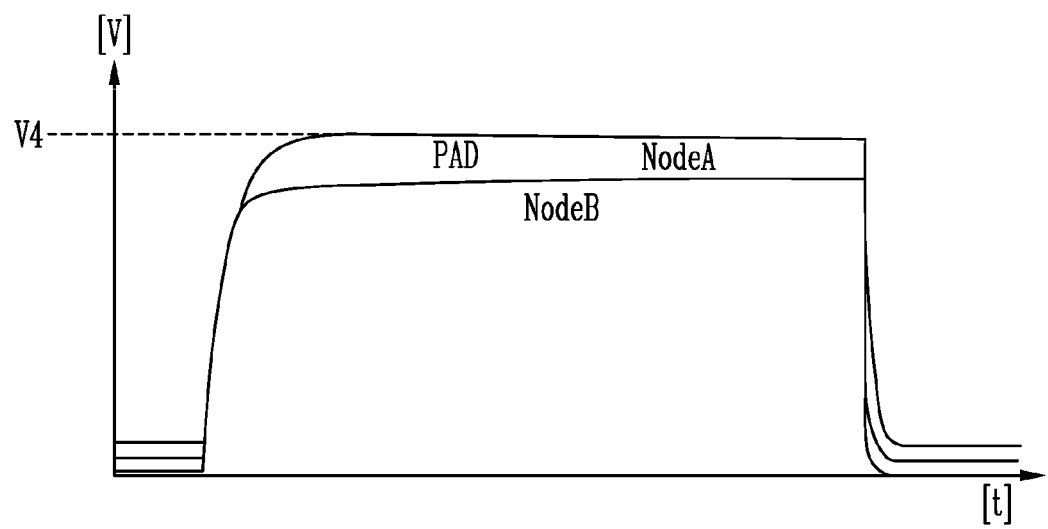
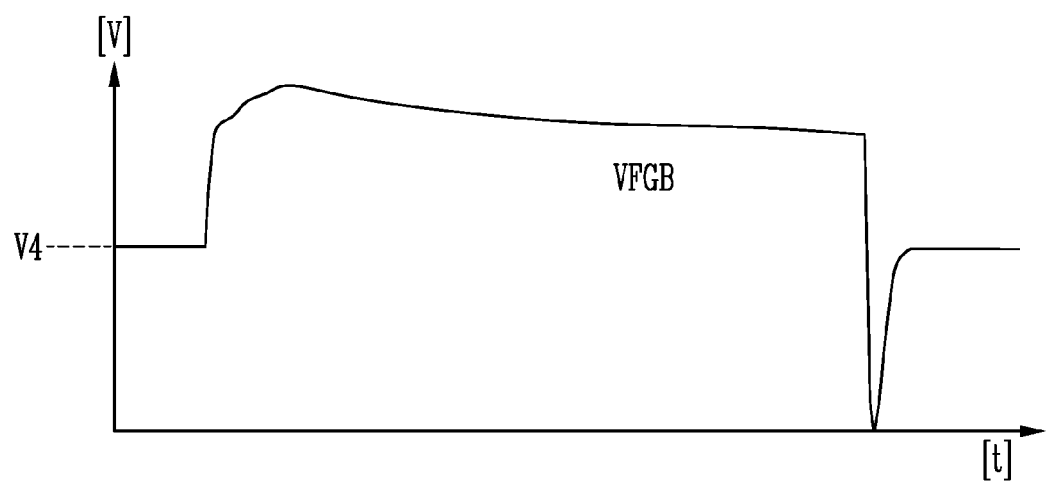

OUTPUT DRIVING CIRCUIT

CROSS-REFERENCE TO RELATED APPLICATION

The present application claims priority under 35 U.S.C. § 119(a) to Korean patent application number 10-2020-0060001, filed on May 19, 2020, in the Korean Intellectual Property Office, the entire disclosure of which is incorporated herein by reference.

BACKGROUND

Field of Invention

The present disclosure relates to an electronic device, and more particularly, to an output driving circuit and a semiconductor device including the same.

Description of Related Art

A high-speed interface IP, which requires a low power voltage and high speed operation, is commonly used in a recent chip. Accordingly, as an element configuring an operation circuit in a chip, for example, CMOSFETs having a medium gate oxide (e.g., a gate oxide for 1.8V operation) or CMOSFETs having a thin film gate oxide (e.g., a gate oxide for 0.9V operation) is more widely used than CMOSFETs having a thick gate oxide (e.g., a gate oxide for 3.3V operation).

However, an input/output (IO) circuit still needs to support an application circuit that requires a relatively high interface voltage (e.g., 3.3V interface voltage). Therefore, an input/output circuit manufactured of CMOSFETs having the medium gate oxide for 1.8V operation or the thin film gate oxide for 0.9V operation are difficult to operate due to problems such as device destruction when a voltage of 3.3V is applied.

SUMMARY

An embodiment of the present disclosure provides an output driving circuit having improved reliability.

An output driving circuit according to an embodiment of the present disclosure includes a pull-down driver and a voltage stabilizer. The pull-down driver includes first, second, and third transistors connected in series between a pad and a ground node. The voltage stabilizer generates a stabilization voltage based on a voltage of the pad and a power voltage, and outputs the stabilization voltage to a control terminal of the second transistor.

In an embodiment, when the voltage of the pad has a first value, and the power voltage has a second value less than the first value, the voltage stabilizer may divide the voltage of the pad and generate the stabilization voltage based on the divided voltage of the pad.

In an embodiment, a value of the stabilization voltage may be sufficient to make a difference between a voltage at an end terminal of the second transistor and a voltage at the control terminal of the second transistor equal to or less than a given value.

In an embodiment, the second value may correspond to a ground voltage, and a value of the stabilization voltage may be less than the first value and greater than the second value.

In an embodiment, the first value may be greater than 1.8V.

In an embodiment, the first value may be greater than 1.8V and less than 3.3V.

In an embodiment, the voltage stabilizer may include a voltage divider and a stabilization voltage generator. The voltage divider may be connected between the pad and a ground. The voltage divider may be configured to divide the voltage of the pad and to output the divided voltage to a first internal node. The stabilization voltage generator may be connected between the power voltage and the first internal node. The stabilization voltage generator may be configured to output the stabilization voltage based on the power voltage.

In an embodiment, the voltage divider may include at least one first diode connected between the power voltage and the first internal node, and at least one second diode connected between the first internal node and the ground.

In an embodiment, the number of the first diodes and the number of the second diodes may be the same.

In an embodiment, the voltage divider may further include a capacitor connected between the first internal node and the ground.

In an embodiment, the stabilization voltage generator may include a fourth transistor and a fifth transistor connected in series between the power voltage and the first internal node. The fourth transistor and the fifth transistor may be connected at a second internal node. The stabilization voltage generator may output a voltage of the second internal node as the stabilization voltage.

In an embodiment, the fourth transistor may be adjacent to the power voltage, and the fifth transistor may be adjacent to the first internal node. Meanwhile, the fifth transistor may be a PMOS transistor, and a gate terminal of the fifth transistor may be connected to the power voltage.

In an embodiment, the fourth transistor may be a PMOS transistor, and a gate terminal of the fourth transistor may be connected to the first internal node.

In an embodiment, the stabilization voltage generator may further include a sixth transistor connected between the power voltage and the second internal node.

In an embodiment, the sixth transistor may be an NMOS transistor, and a gate terminal of the sixth transistor may be connected to the power voltage.

In an embodiment, the fourth transistor may be an NMOS transistor, and a gate terminal of the fourth transistor may be connected to the power voltage.

In an embodiment, when the power voltage may have a third value greater than the second value and less than the first value, the voltage stabilizer may output the power voltage as the stabilization voltage.

In an embodiment, the third value of the power voltage may be about 1.8V.

In an embodiment, the output driving circuit may further include an input/output control logic and a gate control logic. The input/output control logic may receive a clock signal and an enable signal and output a first control signal to the third transistor. The gate control logic may receive the voltage of the pad and output a feedback voltage to a gate terminal of the first transistor.

In an embodiment, the output driving circuit may further include an inverter and an internal resistor. The inverter may invert the enable signal and output the inverted enable signal to the gate control logic. The internal resistor may have a first end connected to the pad and a second end connected to the gate control logic.

In an embodiment, the first, second, and third transistors included in the pull-down driver may be NMOS transistors.

In an embodiment, the gate control logic may include first, second, and third PMOS transistors connected in series between a pad voltage at the second end of the internal resistor and the power voltage. The power voltage may be applied to a gate terminal of the first PMOS transistor, the pad voltage may be applied to a gate terminal of the second PMOS transistor. The inverted enable signal may be applied to a gate terminal of the third PMOS transistor, and a bulk region voltage of the first, second, and third PMOS transistors may be output as the feedback voltage.

In an embodiment, a drain terminal of the first PMOS transistor may be electrically connected to a bulk region of the first PMOS transistor.

In an embodiment, the gate control logic may further include a fourth PMOS transistor connected between the power voltage and the bulk region of the first PMOS transistor. The pad voltage may be applied to a gate terminal of the fourth PMOS transistor.

In an embodiment, a source terminal of the fourth PMOS transistor may be electrically connected to a bulk region of the fourth PMOS transistor.

In an embodiment, the gate control logic may further include a fourth NMOS transistor and a fifth PMOS transistor connected in series between the bulk region and the power voltage. The power voltage may be applied to a gate terminal of the fourth NMOS transistor. A second control signal may be applied to a gate terminal of the fifth PMOS transistor.

According to embodiments of the present disclosure, an output driving circuit having improved reliability may be provided.

BRIEF DESCRIPTION OF THE DRAWINGS

FIG. 5B is a waveform diagram showing an enlarged T2 period of FIG. 5A.

FIG. 13 is a waveform diagram for describing an effect of adding a fourth PMOS transistor of FIG. 11.

FIG. 17 is a waveform diagram illustrating an operation of the output driving circuit of FIG. 14 when an external high voltage VDDH is 1.8V.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Figure 1:
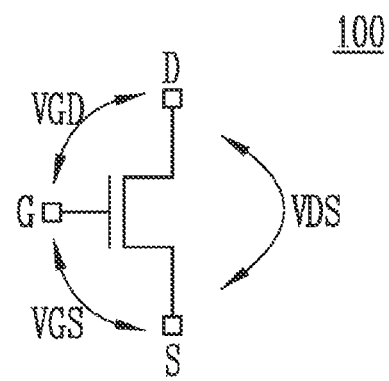
FIG. 1 is a diagram for describing an operating condition of a medium gate oxide device according to an embodiment.

FIG. 1 is a diagram for describing an operating condition of a switching device (e.g., a medium gate oxide device) 100 according to an embodiment.

For a stable operation of the medium gate oxide device 100, a gate-source voltage $V_{GS}$, a gate-drain voltage $V_{GD}$, and a drain-source voltage $V_{DS}$ of the medium gate oxide device 100 are required to satisfy a reliability condition. For example, when the medium gate oxide device 100 is a device for 1.8V operation, reliability of a device is secured when the gate-source voltage $V_{GS}$, the gate-drain voltage $V_{GD}$, and the drain-source voltage $V_{DS}$ is equal to or less than 110% of 1.8V. Accordingly, the reliability condition as shown in [Table 1] may be derived.

TABLE 1

| Voltage Difference | Reliability condition |
| --- | --- |
| VGD | VGD ≤ 1.98 V |
| VGS | VGS ≤ 1.98 V |
| VDS | VDS ≤ 1.98 V |

In order to satisfy such a condition, a conventional output driving circuit is configured of a circuit shown in FIG. 2 or 3, which will be described later.

Figure 2:
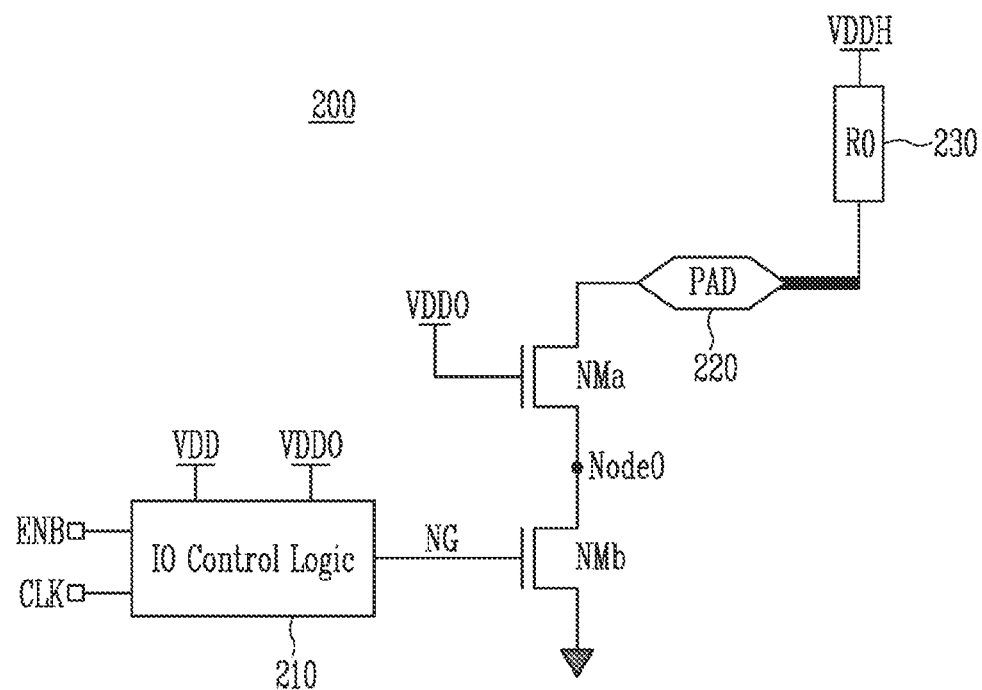
FIG. 2 is a circuit diagram illustrating an example of a conventional output driving circuit.

FIG. 2 is a circuit diagram illustrating an example of the conventional output driving circuit 200.

Referring to FIG. 2, the output driving circuit 200 is configured of an input/output control logic (IO Control Logic) 210, and a first transistor NMa and a second transistor NMb connected in series. The first transistor NMa is connected between a pad 220 and a node Node0, and the second transistor NMb is connected between the node Node0 and ground. A first power voltage VDDO is applied to a gate terminal of the first transistor NMa, and a gate control signal NG output from the input/output control logic 210 is applied to a gate terminal of the second transistor NMb. Meanwhile, the input/output control logic 210 operates based on the first power voltage VDDO and a second power voltage VDD, receives an enable signal ENB and a clock signal CLK, and outputs the gate control signal NG. Meanwhile, the pad 220 is connected to an external high voltage VDDH through an external resistor $R_O$ 230.

Figure 4A:
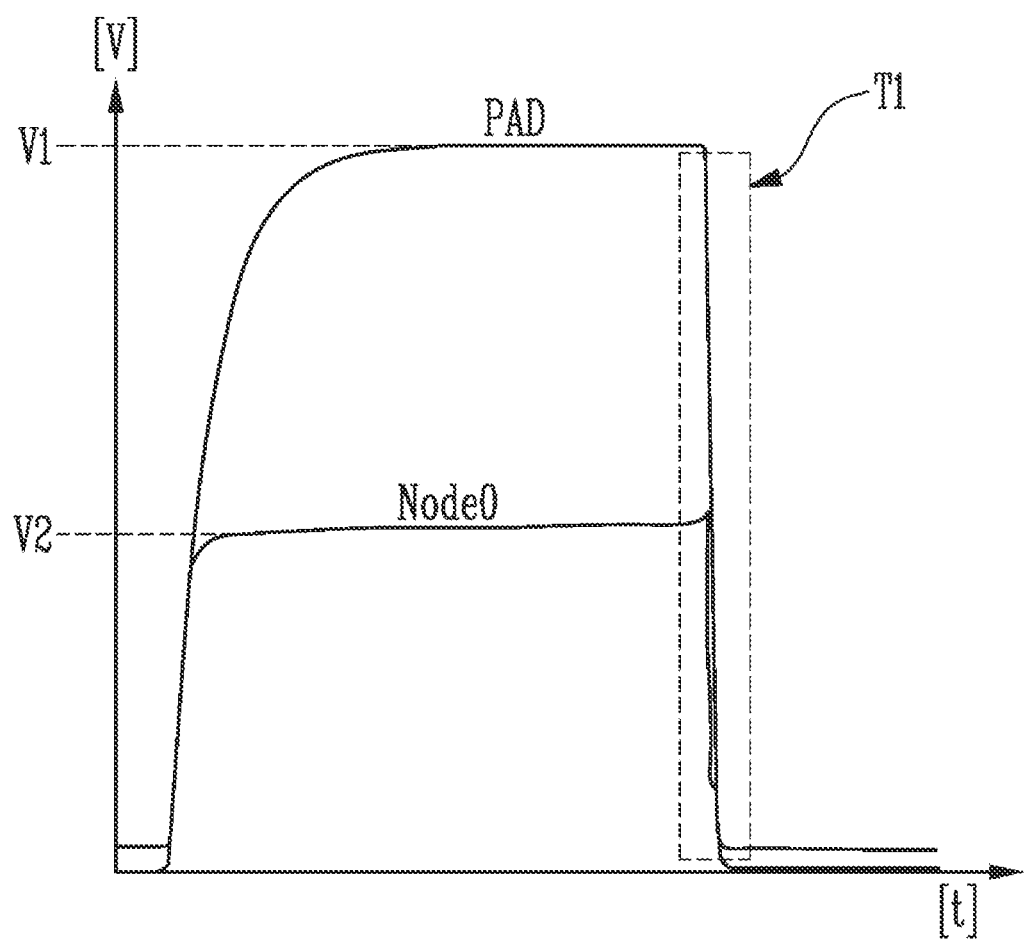
FIG. 4A is an operational waveform diagram of the output driving circuit of FIG. 2.
Figure 4B:
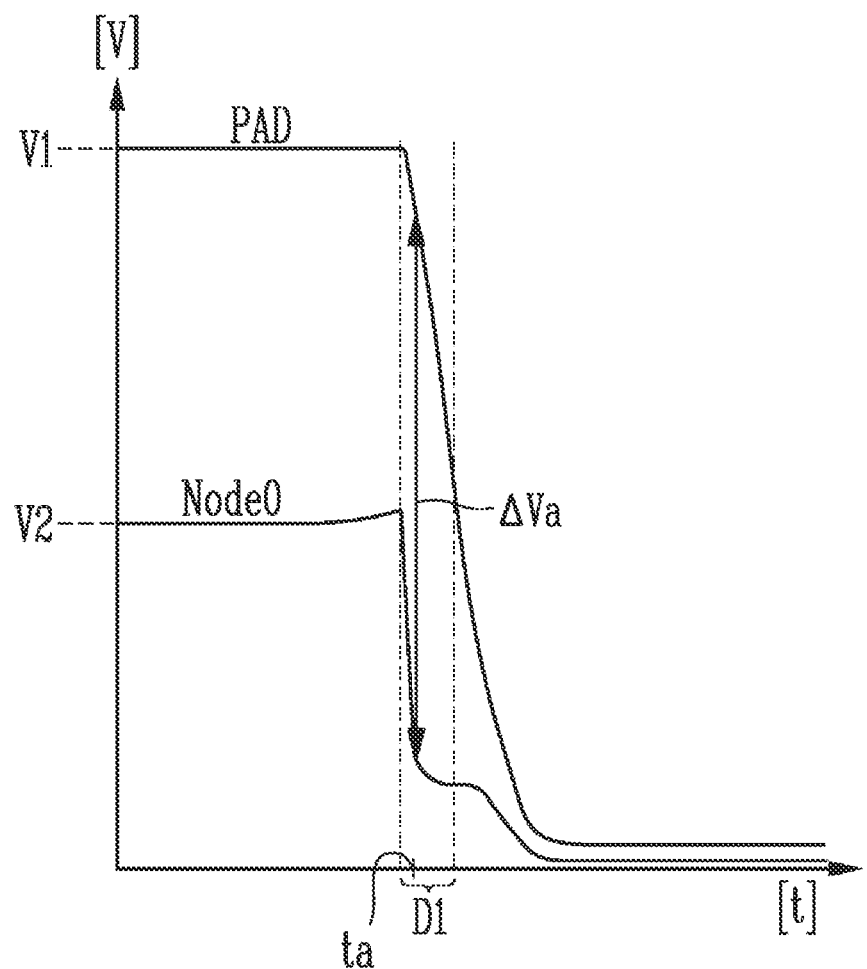
FIG. 4B is a waveform diagram showing an enlarged T1 period of FIG. 4A.

An operation waveform diagram of the output driving circuit 200 of FIG. 2 is shown in FIGS. 4A and 4B. An operation of the output driving circuit 200 shown in FIG. 2 will be described later with reference to FIGS. 4A and 4B.

Figure 3:
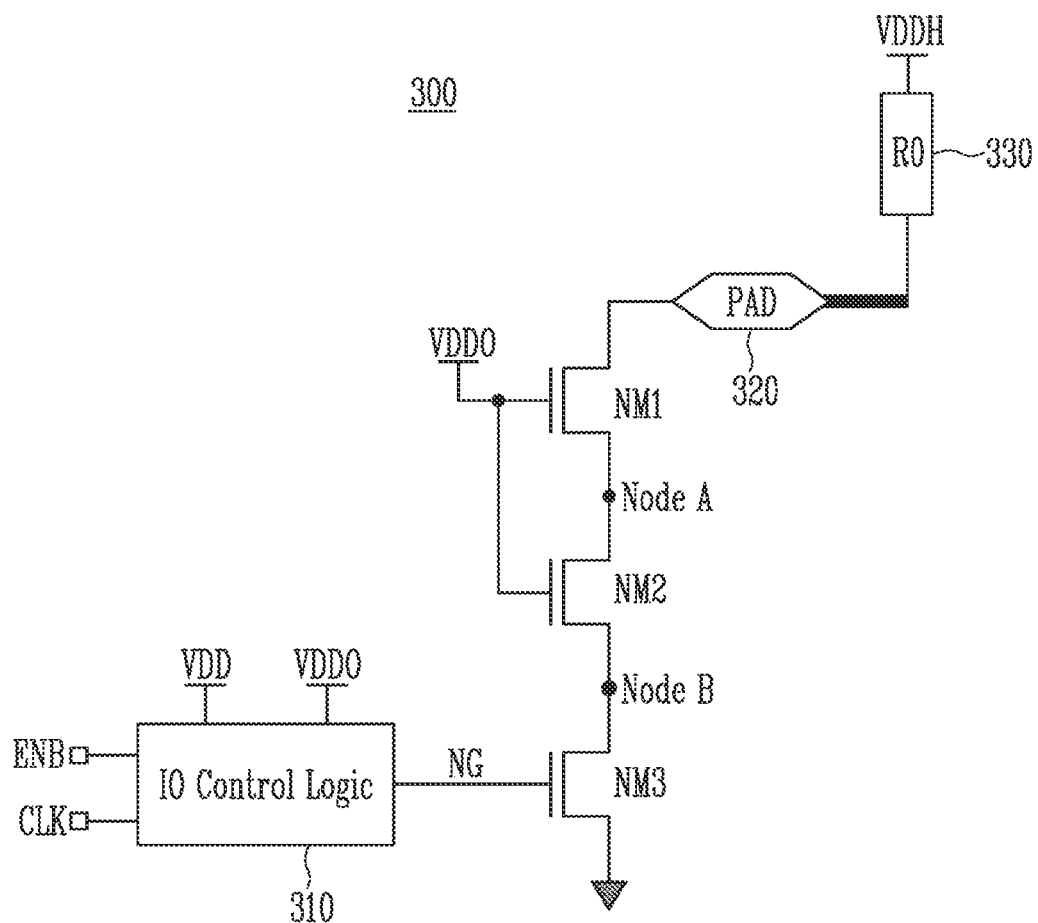
FIG. 3 is a circuit diagram illustrating another example of the conventional output driving circuit.

FIG. 3 is a circuit diagram illustrating another example of the conventional output driving circuit 300.

Referring to FIG. 3, the output driving circuit 300 is configured of an input/output control logic 310, and a first transistor NM1, a second transistor NM2, and a third transistor NM3 connected in series. The first transistor NM1 is connected between a pad 320 and a node A Node A, the second transistor NM2 is connected between the node A Node A and a node B Node B, and the third transistor NM3 is connected between the node B Node B and the ground. The first power voltage VDDO is applied to gate terminals of the first transistor NM1 and the second transistor NM2, and a gate control signal NG output from the input/output control logic 310 is applied to a gate terminal of the third transistor NM3. Meanwhile, the input/output control logic 310 operates based on a first power voltage VDDO and a second power voltage VDD, receives an enable signal ENB and a clock signal CLK, and outputs the gate control signal NG. Meanwhile, the pad 320 is connected to an external high voltage VDDH through an external resistor $R_O$.

Figure 5A:
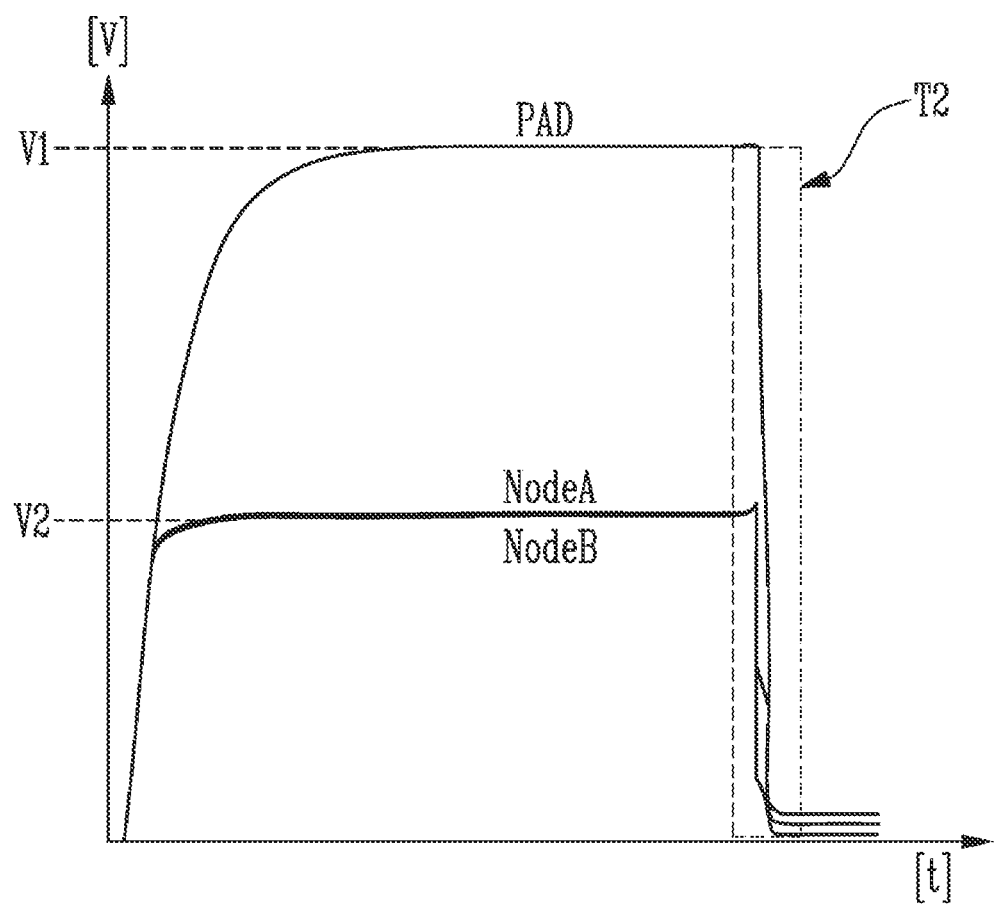
FIG. 5A is an operation waveform diagram of the output driving circuit of FIG. 3.

An operation waveform diagram of the output driving circuit 300 of FIG. 3 is shown in FIGS. 5A and 5B. An operation of the output driving circuit 300 shown in FIG. 3 will be described later with reference to FIGS. 5A and 5B.

The conventional output driving circuits 200 and 300 shown in FIGS. 2 and 3 use a thick gate oxide element (2.5V or 3.3V element). Therefore, in interfacing a 3.3V or 5V signal, an oxide thickness is thick. Thus, reliability of an element is secured even though the gate-drain voltage $V_{GD}$ and the drain-source voltage $V_{DS}$ are in a section that is somewhat out of reliability. However, when driving the interfacing of 3.3V using a medium gate oxide element (1.8V element) in a current process of 32 nanometers or less, the oxide thickness of the element becomes thinner, meeting the reliability condition becomes difficult.

FIG. 4A is the operational waveform diagram of the output driving circuit 200 of FIG. 2. In addition, FIG. 4B is a waveform diagram showing an enlarged T1 period of FIG. 4A.

Referring to FIG. 4A, a voltage of the pad 220 and a voltage of the node Node0 are shown. The voltage of the pad 220 may increase to a first level V1, and the voltage of the node Node0 may increase to a second level V2. The first level V1 may be about 3.5V, and the second level V2 may be about 1.6V. Accordingly, a difference between the voltage of the pad 220 and the voltage of the node Node0 is maintained as about 2V or less. Therefore, a condition of the drain-source voltage $V_{DS}$ of the first transistor NMa is satisfied. However, as the voltage of the pad 220 rapidly decreases, the voltage of the node Node0 also decreases, and in this case, a situation in which the reliability condition of the drain-source voltage $V_{DS}$ is not satisfied occurs as will be described below with reference to FIG. 4B.

Referring to FIG. 4B, the waveform diagram of the T1 period shown by a dotted line in FIG. 4A is enlarged. As shown in FIG. 4B, in a D1 period in which the voltage of the pad 210 and the voltage of the node Node0 decreases during the T1 period, the difference between the voltage of the pad 210 and the voltage of the node Node0 may be temporarily a value ΔVa greater than a difference (for example, about 2V) between the first level V1 and the second level V2. For example, the value ΔVa at a time ta may be 2.9V. In this case, the difference between the voltage of the pad 210 and the voltage of the node Node0 is temporarily 2.9V, which is a situation in which the reliability condition of the drain-source voltage $V_{DS}$ of the 1.8V element is not satisfied.

FIG. 5A is the operation waveform diagram of the output driving circuit 300 of FIG. 3. Meanwhile, FIG. 5B is a waveform diagram showing an enlarged T2 period of FIG. 5A.

Referring to FIG. 5A, a voltage of the pad 320, a voltage of the node A Node A, and a voltage of the node B Node B are shown. The voltage of the pad 320 may increase to a first level V1, and the voltage of the node A Node A and the voltage of the node B Node B may increase to a second level V2. The first level V1 may be about 3.5V, and the second level V2 may be about 1.6V. Accordingly, on the whole, a difference between the voltage of the pad 320 and the voltage of the node A Node A or a difference between the voltage of the pad 320 and the voltage of the node B Node B is maintained as about 2V or less. Therefore, a condition of the drain-source voltage $V_{DS}$ of the second transistor NM2 is satisfied. However, as the voltage of the pad 320 rapidly decreases, a situation in which a reliability condition of the drain-source voltage $V_{DS}$ of the first transistor NM1 and the second transistor NM2 is not satisfied occurs as will be described below with reference to FIG. 5B.

Referring to FIG. 5B, the waveform diagram of the T2 period shown by a dotted line in FIG. 5A is enlarged. As shown in FIG. 5B, in a D2 period in which the voltage of the pad 320 and the voltage of the node A Node A decreases during the T2 period, the difference between the voltage of the pad 320 and the voltage of the node A Node A may be temporarily a value greater than a difference (for example, about 2V) between the first level V1 and the second level V2. For example, the difference between the voltage of the pad 320 and the voltage of the node A Node A is temporarily 2.8V, which is a situation in which the reliability condition of the drain-source voltage $V_{DS}$ of the 1.8V element is not satisfied.

Therefore, a structure of a new output driving circuit having improved reliability may be desirable.

Figure 6:
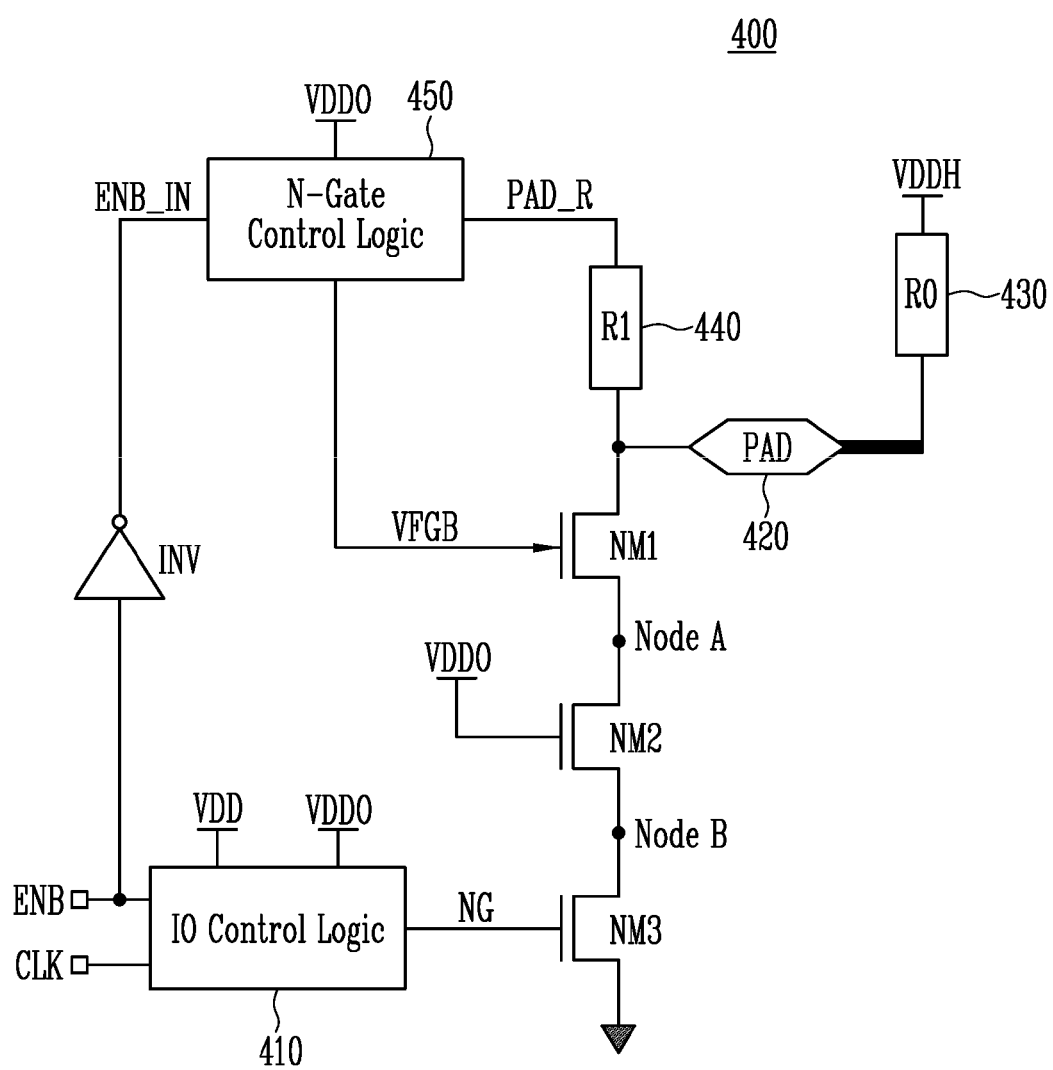
FIG. 6 is a circuit diagram illustrating an output driving circuit according to an embodiment of the present disclosure.

FIG. 6 is a circuit diagram illustrating an output driving circuit 400 according to an embodiment of the present disclosure.

Referring to FIG. 6, the output driving circuit 400 according to an embodiment of the present disclosure includes first, second, and third transistors NM1, NM2, and NM3 which are sequentially connected in series between a pad 420 and a ground node, an input/output control logic 410, a gate control logic 450, and an inverter INV. The input/output control logic 410 receives a clock signal CLK and an enable signal ENB, and transfers a first control signal NG to the third transistor NM3. The gate control logic 450 receives a voltage PAD_R of the pad 420. In addition, the gate control logic 450 outputs a feedback voltage VFGB to a gate terminal of the first transistor NM1. The inverter INV inverts the enable signal ENB and outputs an inverted enable signal ENB_IN to the gate control logic 450. Meanwhile, the pad 420 is connected to an external high voltage VDDH through an external resistor $R_O$. In addition, the output driving circuit 400 may further include an internal resistor $R_1$ connected between the pad 420 and the gate control logic 450. In an embodiment, the internal resistor $R_1$ may be used as an ESD protection resistor.

The first, second, and third transistors NM1, NM2, and NM3 of the output driving circuit 400 may be a medium gate oxide element of a 1.8V operation element. For reliability improvement, a three-stage series connection structure is configured as shown in the drawing. Meanwhile, the first, second, and third transistors NM1, NM2, and NM3 of the output driving circuit 400 have open-drain output structures. The gate terminal of the first transistor NM1 receives a feedback voltage VFGB, and a voltage level of the feedback voltage VFGB is changed according to a level of the open-drain output. Meanwhile, the first power voltage VDDO may be 1.8V, and the external high voltage VDDH may be 3.3V. When the output is activated, the enable signal ENB becomes a high state, and when the clock signal CLK is a high state, the pad 420 becomes a high state by the external high voltage VDDH connected by the external resistor $R_O$ 430. When the clock signal CLK is a low state, an NMOS driver of the open-drain output structure is turned on, and thus the pad 420 operates to be a low state. Here, a detailed configuration of the gate control logic 450 will be described later with reference to FIGS. 7 and 8.

Figure 7:
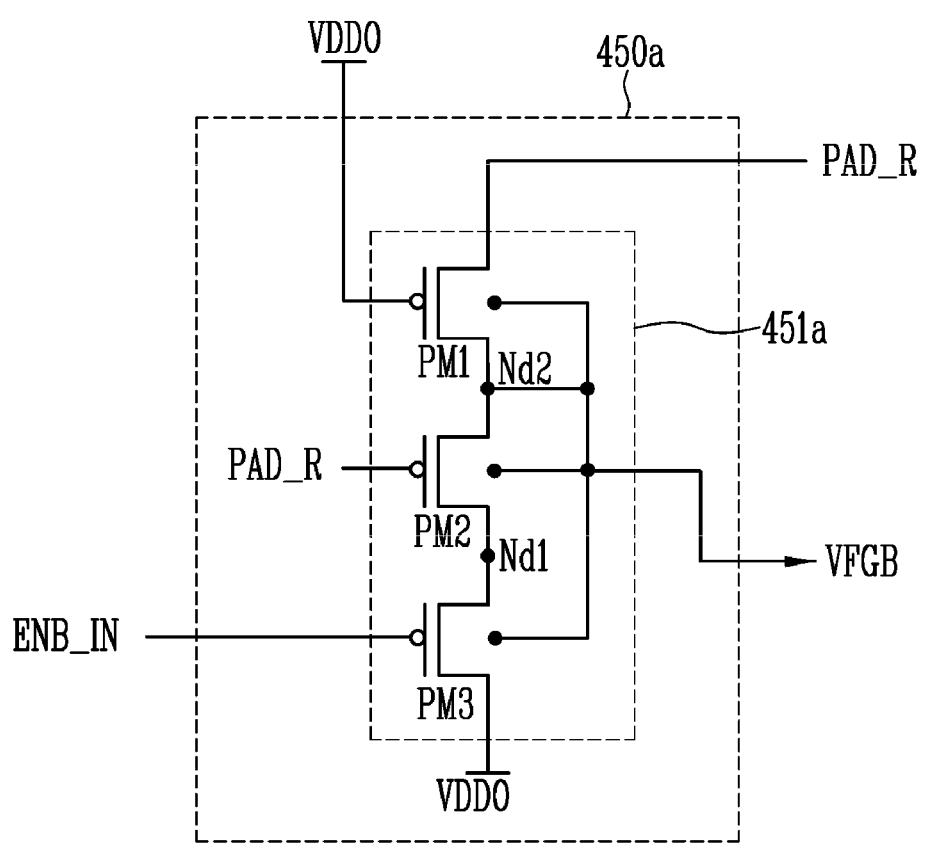
FIG. 7 is a circuit diagram illustrating a gate control logic suitable for use as a gate control logic of FIG. 6 according to an embodiment.

FIG. 7 is a circuit diagram illustrating a gate control logic 450a suitable for use as the gate control logic 450 of FIG. 6, according to an embodiment.

Referring to FIG. 7, the gate control logic 450a includes first, second, and third PMOS transistors PM1, PM2, and PM3 sequentially connected in series between the pad voltage PAD_R and the first power voltage VDDO. A series connection structure of the first, second, and third PMOS transistors PM1, PM2, and PM3 may configure a feedback transistor component 451a. A drain electrode of the first PMOS transistor PM1 and a source electrode of the second PMOS transistor PM2 are connected to a node Nd2. In addition, a drain electrode of the second PMOS transistor PM2 and a source electrode of the third PMOS transistor PM3 are connected to a node Nd1. Meanwhile, the first power voltage VDDO is applied to a gate terminal of the first PMOS transistor PM1, a pad voltage PAD_R is applied to a gate terminal of the second PMOS transistor PM2, and the inverted enable signal ENB_IN is applied to a gate terminal of the third PMOS transistor PM3. In addition, bulk regions of the first, second, and third PMOS transistors PM1, PM2, and PM3 are connected to the feedback voltage VFGB.

When the clock signal CLK is a low state, the pad voltage PAD_R becomes a low state. Accordingly, the second PMOS transistor PM2 is turned on and thus the first power voltage VDDO (that is, 1.8V) is output as a feedback signal VFGB. Accordingly, the first transistor NM1 of FIG. 6 maintains a turn-on state. At this time, a gate voltage of the first PMOS transistor PM1 is the first power voltage VDDO. As the pad 420 is a low state, the first PMOS transistor PM1 is turned off. As a result, a current path from the first power voltage VDDO connected to the third PMOS transistor PM3 to the pad voltage PAD_R is cut off.

Thereafter, when the voltage of the pad 420 is changed from 0V to the external high voltage VDDH (that is, 3.3V) at a time point when the clock signal CLK is changed to a high state, the first PMOS transistor PM1 is turned on at a time point when the pad voltage PAD_R is greater than the sum of the first power voltage VDDO and a threshold voltage Vth_PM1 of the first PMOS transistor, and thus the feedback voltage VFGB follows a voltage level of the pad 420. At this time, the feedback voltage VFGB is in a state in which the feedback voltage VFGB increases from the first power voltage VDDO to the external high voltage VDDH. In addition, the second PMOS transistor PM2 is turned off as the pad voltage PAD_R, which is a gate voltage of the second PMOS transistor PM2, becomes equal to the feedback voltage VFGB. Therefore, a current path from an output terminal of the feedback voltage VFGB to the first power voltage VDDO connected to the third PMOS transistor PM3 is cut off. Thus, power consumption is reduced and a decrease of the feedback voltage VFGB is substantially prevented. In addition, in a case of the second PMOS transistor PM2, even though the feedback voltage VFGB increases to 3.3V as a voltage of a node C Node C is 1.8 V, a voltage difference between a gate-source voltage VGS, a gate-drain voltage VGD, and a drain-source voltage VDS is maintained within 1.98V, and thus a reliability condition of the second PMOS transistor PM2 is also satisfied.

That is, the output driving circuit 400 according to an embodiment of the present disclosure maintains the voltage difference between the pad 420 and the node A Node A to be 1.98V or less even when the clock signal CLK transitions from a low state to a high state, that is, when the voltage of the pad 420 transitions from the external high voltage VDDH to 0V, among characteristics of the open-drain output structure, and thus reliability of the device is improved. An operation waveform diagram of the output driving circuit 400 according to the embodiment of FIGS. 6 and 7 is shown in FIGS. 9A and 9B, and the operation characteristic will be described later with reference to FIGS. 9A and 9B.

Figure 8:
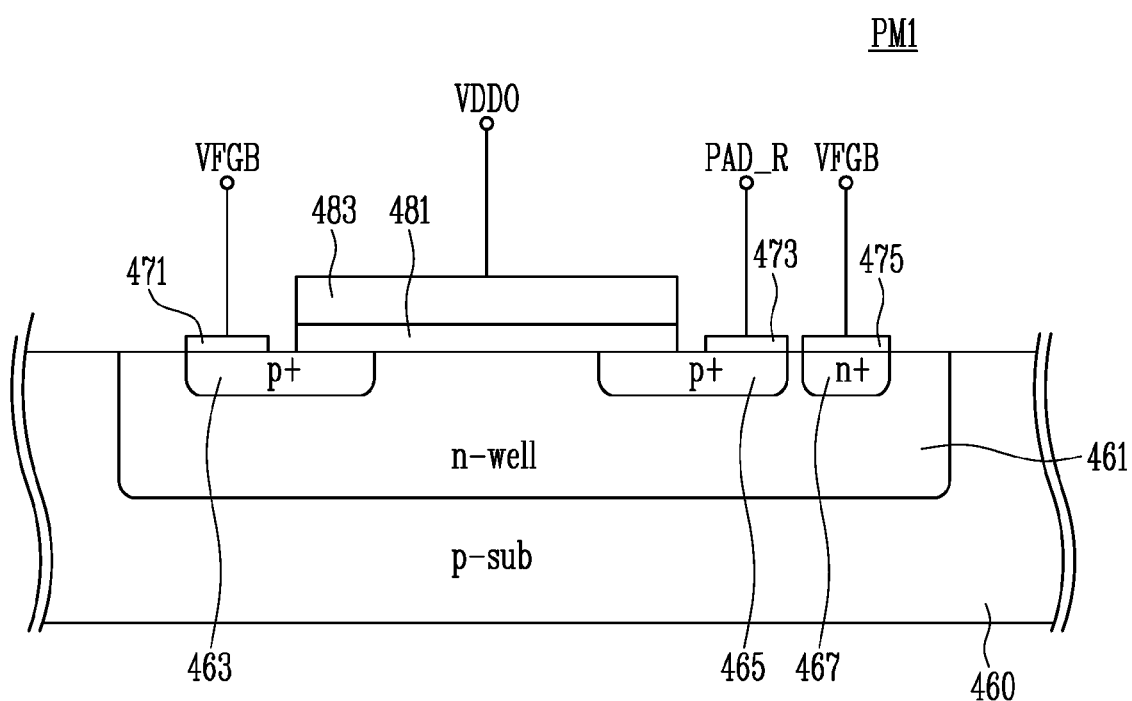
FIG. 8 is a diagram illustrating a specific configuration of a first PMOS transistor of FIG. 7 according to an embodiment.

FIG. 8 is a diagram illustrating a specific configuration of the first PMOS transistor PM1 of FIG. 7 according to an embodiment.

In FIG. 7, a bulk region voltage of the first PMOS transistor PM1 is connected to the feedback voltage VFGB. In FIG. 8, such a structure of the first PMOS transistor PM1 is specifically shown.

Referring to FIG. 8, an n-well 461 is formed on a p-type substrate 460. The n-well 461 may function as a bulk region of the first PMOS transistor PM1. Meanwhile, a source region 465 and a drain region 463 are formed on the n-well 461. The source region 465 and the drain region 463 may be formed as high concentration p+ regions. A source electrode 473 and a drain electrode 471 are formed on the source region 465 and the drain region 463, respectively. In addition, an insulating layer 481 and a gate electrode 483 are formed on the n-well 461. Therefore, a PMOS transistor PM1 is configured. In addition, a high concentration n+ region 467 is further formed on the n-well 461 to provide electrical connection with the n-well 461 which is the bulk region. A bulk electrode 475 is formed on the n+ region 467.

Meanwhile, referring to an electrode connection of the first PMOS transistor PM1, the source electrode 473 is connected to the pad voltage PAD_R, the drain electrode 471 is connected to the feedback voltage VFGB, and the gate electrode 483 is connected to the first power voltage VDDO. In addition, the bulk electrode 475 may be connected to the feedback voltage VFGB to configure an electrical connection relationship of the first PMOS transistor PM1 shown in FIG. 7.

Figure 9:
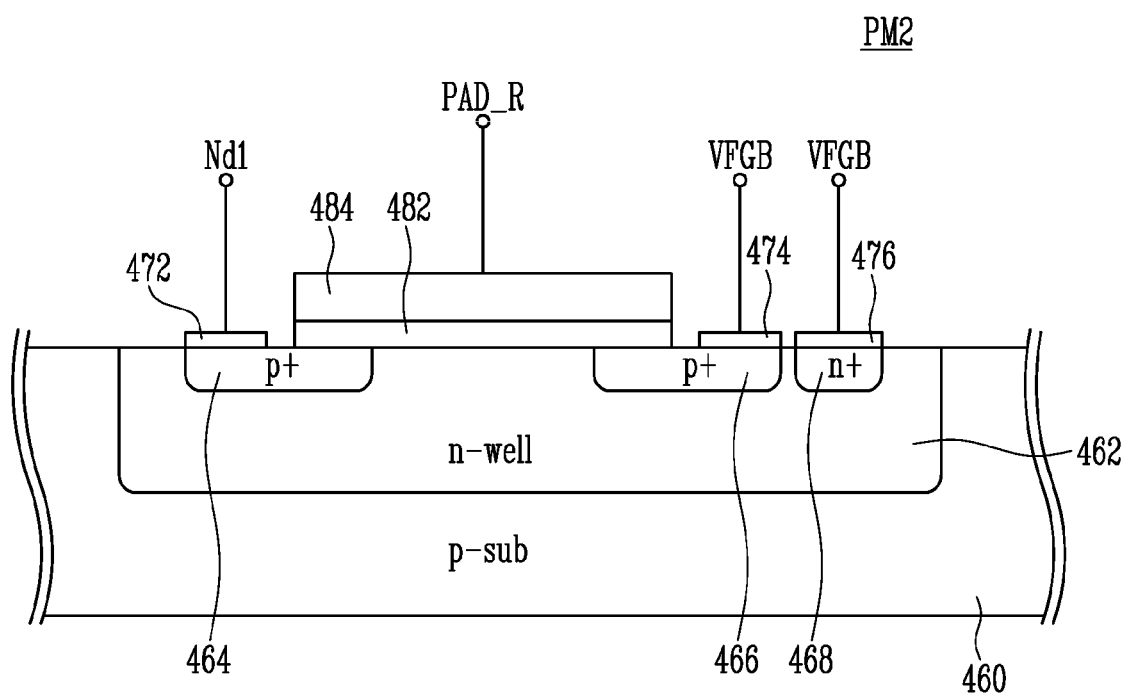
FIG. 9 is a diagram illustrating a specific configuration of a second PMOS transistor of FIG. 7 according to an embodiment.

FIG. 9 is a diagram illustrating a specific configuration of the second PMOS transistor PM2 of FIG. 7 according to an embodiment.

In FIG. 7, a bulk region voltage of the second PMOS transistor PM2 is connected to the feedback voltage VFGB. In FIG. 9, a structure of the second PMOS transistor PM2 is specifically shown.

Referring to FIG. 9, an n-well 462 is formed on a p-type substrate 460. The n-well 462 may function as a bulk region of the second PMOS transistor PM2. Meanwhile, a source region 466 and a drain region 464 are formed on the n-well 462. The source region 466 and the drain region 464 may be formed as high concentration p+ regions. A source electrode 474 and a drain electrode 472 are formed on the source region 466 and the drain region 464, respectively. In addition, an insulating layer 482 and a gate electrode 484 are formed on the n-well 462. Therefore, a PMOS transistor is configured. In addition, a high concentration n+ region 468 is further formed on the n-well 462 to provide an electrical connection with the n-well 462 which is the bulk region. A bulk electrode 476 is formed on the n+ region 468.

Meanwhile, referring to an electrode connection of the second PMOS transistor PM2, the source electrode 474 is connected to the feedback voltage VFGB, the drain electrode 472 is connected to the node Nd1, and the gate electrode 484 is connected to the pad voltage PAD_R. In addition, the bulk electrode 476 may be connected to the feedback voltage VFGB to configure an electrical connection relationship of the second PMOS transistor PM2 shown in FIG. 7.

Figure 10:
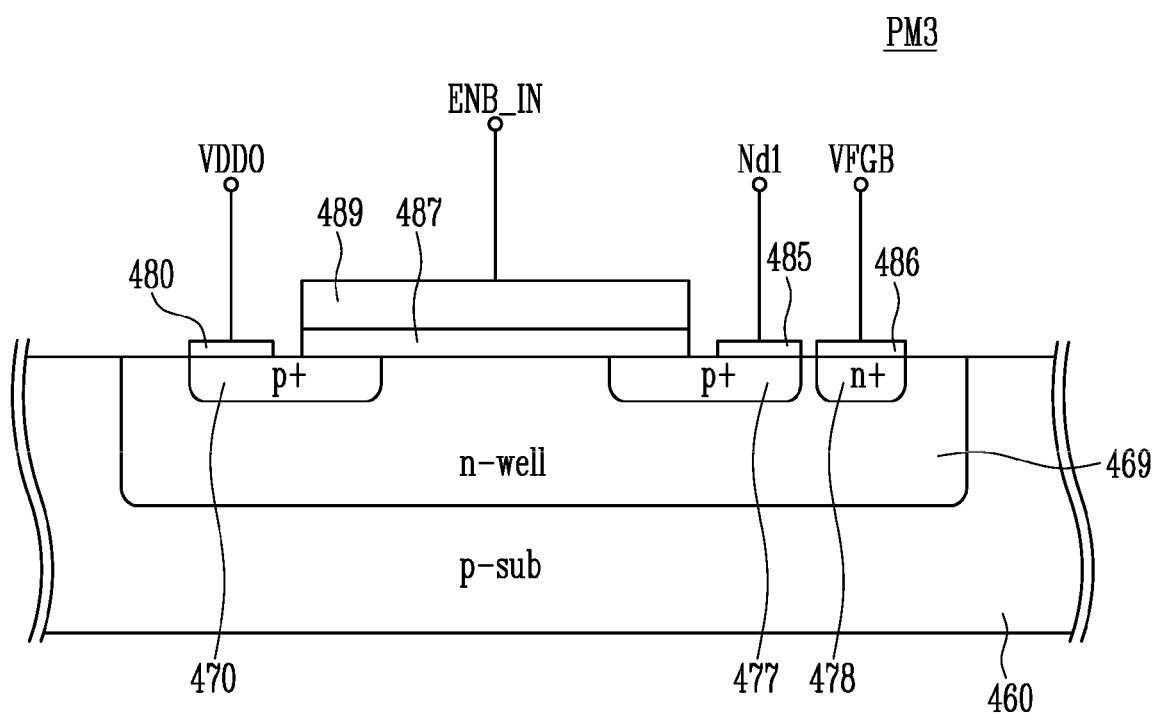
FIG. 10 is a diagram illustrating a specific configuration of a third PMOS transistor of FIG. 7 according to an embodiment.

FIG. 10 is a diagram illustrating a specific configuration of the third PMOS transistor PM3 of FIG. 7 according to an embodiment.

In FIG. 7, a bulk region voltage of the third PMOS transistor PM3 is connected to the feedback voltage VFGB. In FIG. 10, a structure of the third PMOS transistor PM3 is specifically shown.

Referring to FIG. 10, an n-well 469 is formed on a p-type substrate 460. The n-well 469 may function as a bulk region of the third PMOS transistor PM3. Meanwhile, a source region 477 and a drain region 470 are formed on the n-well 469. The source region 477 and the drain region 470 may be formed as high concentration p+ regions. A source electrode 485 and a drain electrode 480 are formed on the source region 477 and the drain region 470, respectively. In addition, an insulating layer 487 and a gate electrode 489 are formed on the n-well 469. Therefore, a PMOS transistor is configured. In addition, a high concentration n+ region 478 is further formed on the n-well 469 to provide an electrical connection with the n-well 469 which is the bulk region. A bulk electrode 486 is formed on the n+ region 478.

Meanwhile, referring to an electrode connection of the third PMOS transistor PM3, the source electrode 485 is connected to the node Nd1, the drain electrode 480 is connected to the first power voltage VDDO, and the gate electrode 489 is connected to the inverted enable signal ENB_IN. In addition, the bulk electrode 486 is connected to the feedback voltage VFGB to form an electrical connection relationship of the third PMOS transistor PM3 shown in FIG. 7.

Figure 11:
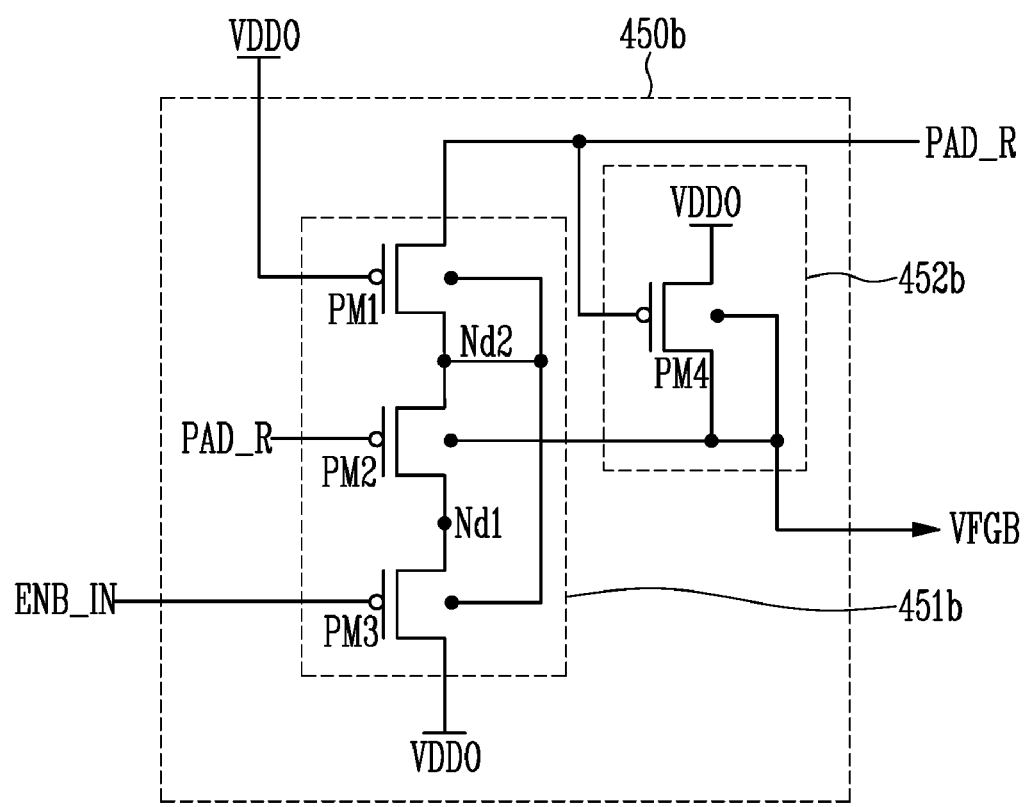
FIG. 11 is a circuit diagram illustrating a gate control logic suitable for use as the gate control logic of FIG. 6 according to another embodiment.

FIG. 11 is a circuit diagram illustrating a gate control logic 450b suitable for used as the gate control logic 450 of FIG. 6 according to another embodiment.

A structure of the gate control logic 450b according to FIG. 11 is similar to that of the gate control logic 450a of FIG. 7 and has a difference in that the gate control logic 450b further includes a fourth PMOS transistor PM4. The fourth PMOS transistor PM4 may configure a voltage stabilizer 452b. That is, the gate control logic 450b includes a feedback transistor component 451b and the voltage stabilizer 452b. An effect obtained by further including the fourth PMOS transistor PM4 will be described later with reference to FIG. 13.

Figure 12A:
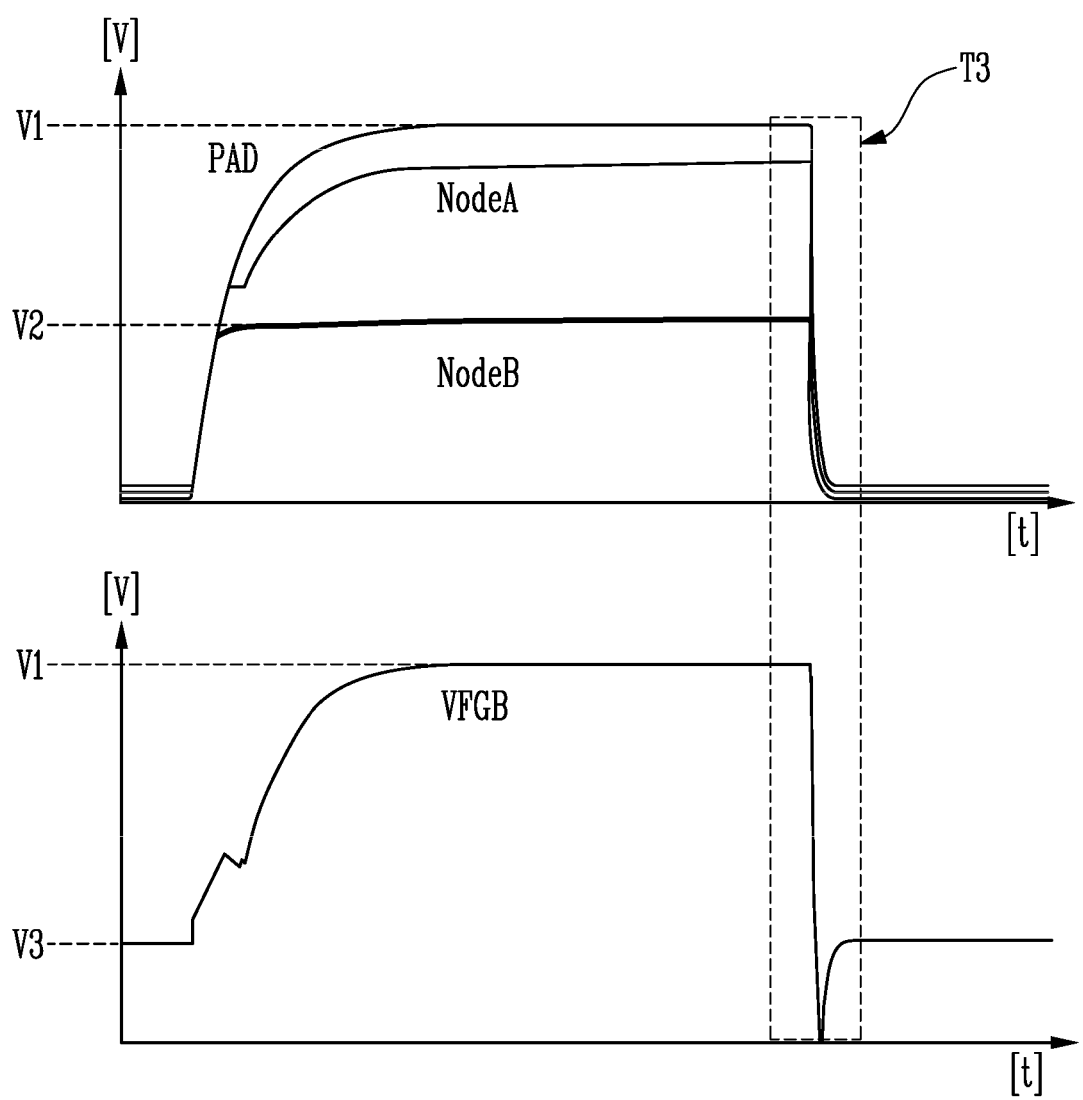
FIG. 12A is an operation waveform diagram of the output driving circuit of FIG. 6 according to an embodiment.

FIG. 12A is an operation waveform diagram of the output driving circuit 400 of FIG. 6 according to an embodiment. Meanwhile, FIG. 12B is a waveform diagram showing an enlarged T3 period of FIG. 12A.

Referring to FIG. 12A, when the clock signal CLK transitions from a low state to a high state, the voltage of the pad 420 changes from the external high voltage VDDH to 0V. A voltage level of the external high voltage VDDH may be a first level V1. The first level V1 may be 3.5V. The voltage of the node A Node A may change from a level slightly less than the voltage of the pad 420 to 0V. Meanwhile, the voltage of the node B Node B may change from a second level V2 to 0V. The second level V2 may be about 1.6V.

As the voltage of the pad 420 changes to 0V, a voltage level of the feedback voltage VFGB may change from the first level V1 to a third level V3. The third level V3 may be about 1.8V. Therefore, the voltage level of the feedback voltage VFGB changes from 3.5V to 1.8V.

Figure 12B:
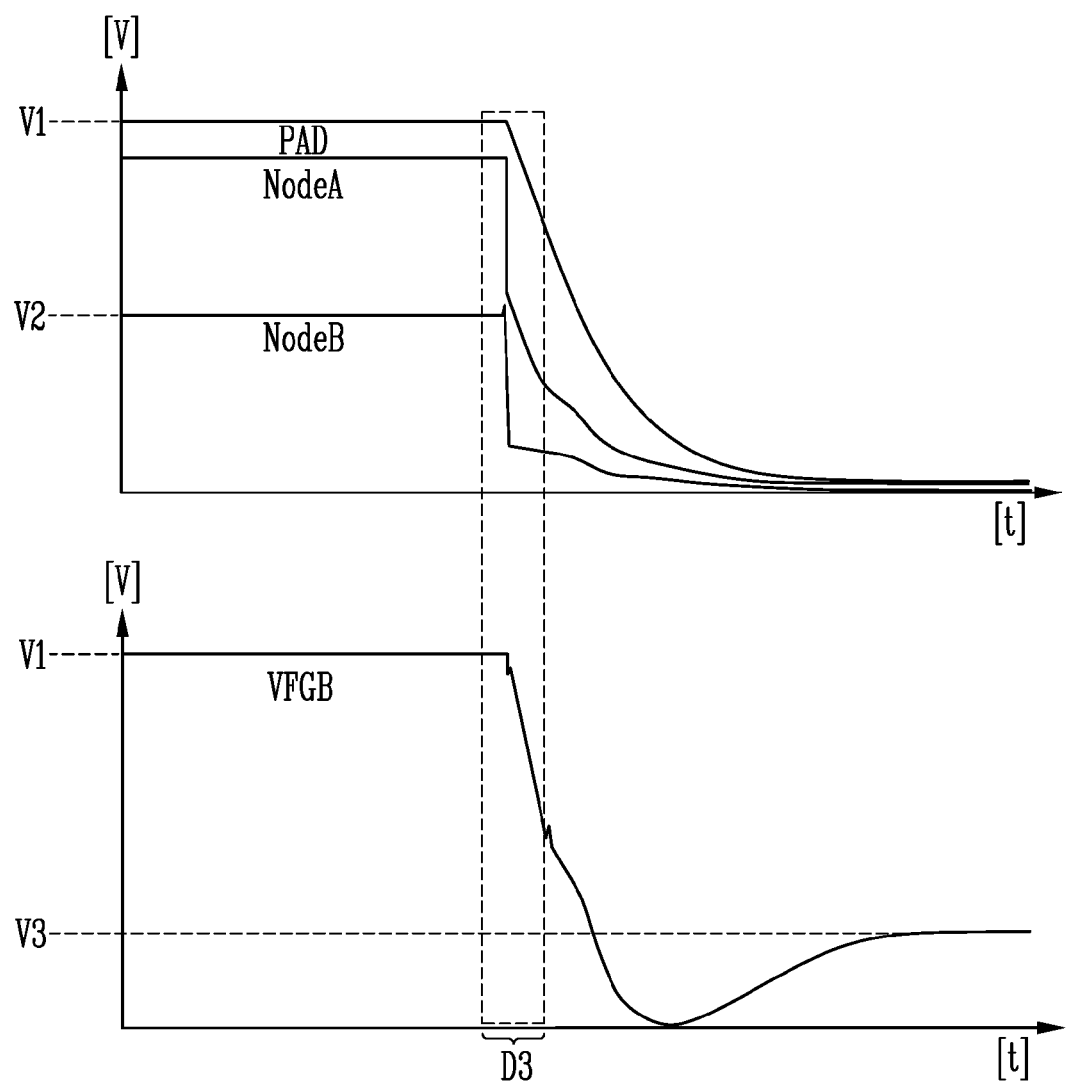
FIG. 12B is a waveform diagram showing an enlarged T3 period of FIG. 12A.

Referring to FIG. 12B, the waveform diagram of the T3 period shown by a dotted line in FIG. 12A is enlarged. As shown in FIG. 12B, in a D3 period in which the voltage of the pad 420, the voltage of the node A Node A, and voltage of the node B Node B decrease during the T3 period, a difference between the voltage of the pad 420 and the voltage of the node A Node A may maintain a value less than a difference (for example, about 2V) between the first level V1 and the second level V2. In addition, in the D3 period, a difference between the voltage of the node A Node A and the voltage of the node B Node B may maintain a value less than the difference (for example, about 2V) between the first level V1 and the second level V2.

That is, after applying a bias of the pad 420 to the gate of the first transistor NM1, a gate bias is switched to 1.8V. Accordingly, a voltage level is gradually lowered in a state in which the voltage of the node A Node A is increased by VDDH−Vth_NM1 to minimize the difference between the voltage of the pad 420 and the voltage of the node A Node A and the difference between the voltage of the node A Node A and the voltage of the node B Node B. Accordingly, reliability conditions of the first and second transistors NM1 and NM2 are satisfied.

FIG. 13 is a waveform diagram for describing the effect of adding the fourth PMOS transistor PM4 shown in FIG. 11, that is, the voltage stabilizer 452b. In FIG. 13, the pad voltage, the feedback voltage VFGB when the fourth PMOS transistor PM4 is not present, and the feedback voltage VFGB when the fourth PMOS transistor PM4 is added are sequentially shown.

When the fourth PMOS transistor PM4 is not present, the feedback voltage VFGB is unstable in a region A and a region B. However, when the fourth PMOS transistor PM4 is added, the feedback voltage VFGB may be stable in a region C and a region D.

Figure 14:
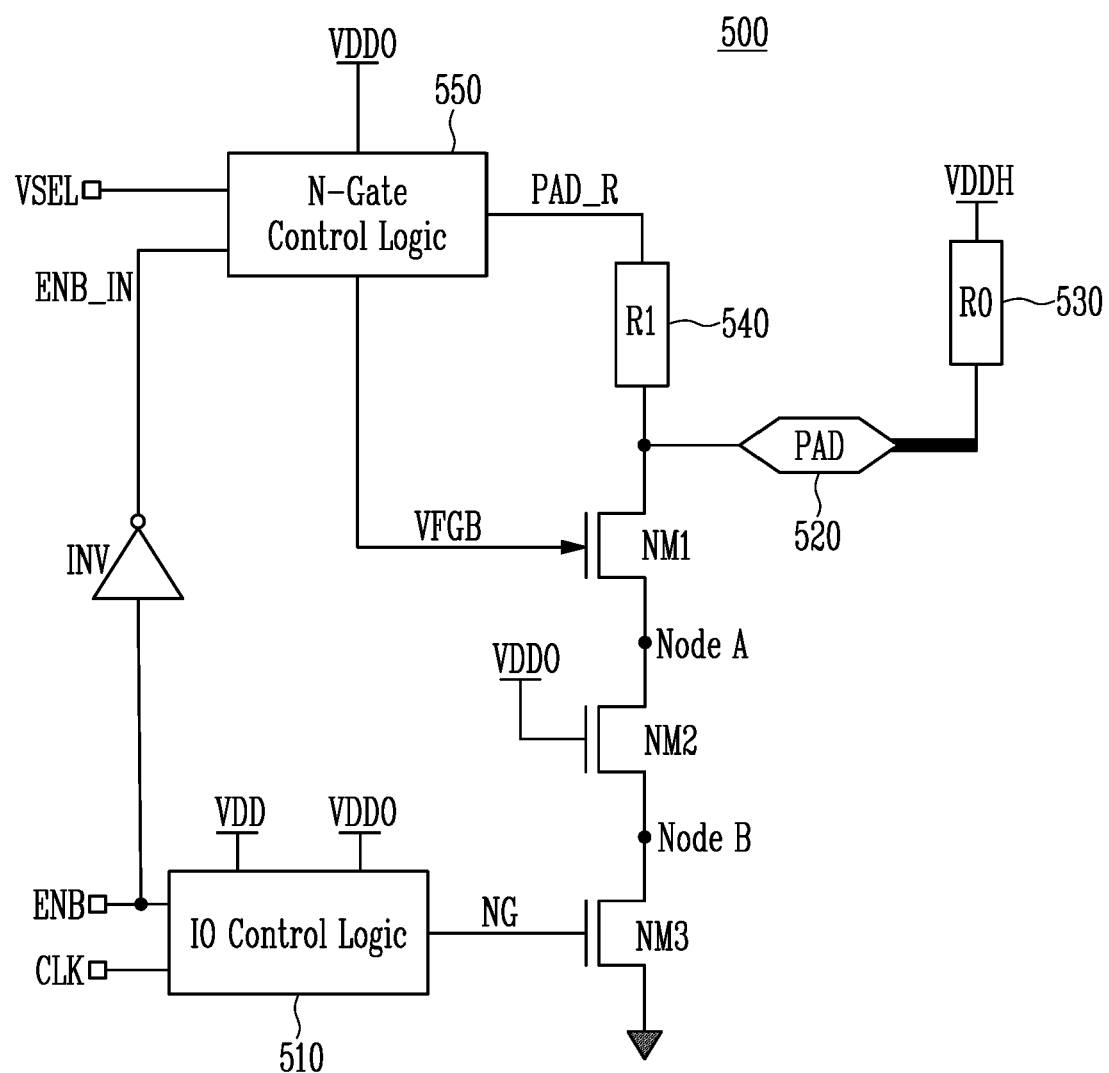
FIG. 14 is a circuit diagram illustrating an output driving circuit according to another embodiment of the present disclosure.

FIG. 14 is a circuit diagram illustrating an output driving circuit 500 according to another embodiment of the present disclosure.

Referring to FIG. 14, the output driving circuit 500 according to an embodiment of the present disclosure includes first, second, and third transistors NM1, NM2, and NM3, which are sequentially connected in series between a pad 520 and a ground node, an input/output control logic 510, a gate control logic 550, and an inverter INV. The input/output control logic 510 receives a clock signal CLK and an enable signal ENB, and transfers a first control signal NG to the third transistor NM3. The gate control logic 550 receives a voltage PAD_R of the pad 520. In addition, the gate control logic 550 outputs a feedback voltage VFGB to a gate terminal of the first transistor NM1. The inverter INV inverts the enable signal ENB and transfers an inverted enable signal ENB_IN to the gate control logic 550. In addition, the gate control logic 550 receives a second control signal VSEL. Meanwhile, the pad 520 is connected to an external high voltage VDDH through an external resistor $R_0$. In addition, the output driving circuit 500 may further include an internal resistor $R_1$ connected between the pad 520 and the gate control logic 550. As described above, the internal resistor $R_1$ may be used as an ESD protection resistor. A difference between the output driving circuit 500 of FIG. 14 and the output driving circuit 400 of FIG. 6 is that the gate control logic 550 further receives the second control signal VSEL. Specific configuration and operation of the gate control logic 550 will be described later with reference to FIG. 15.

Figure 15:
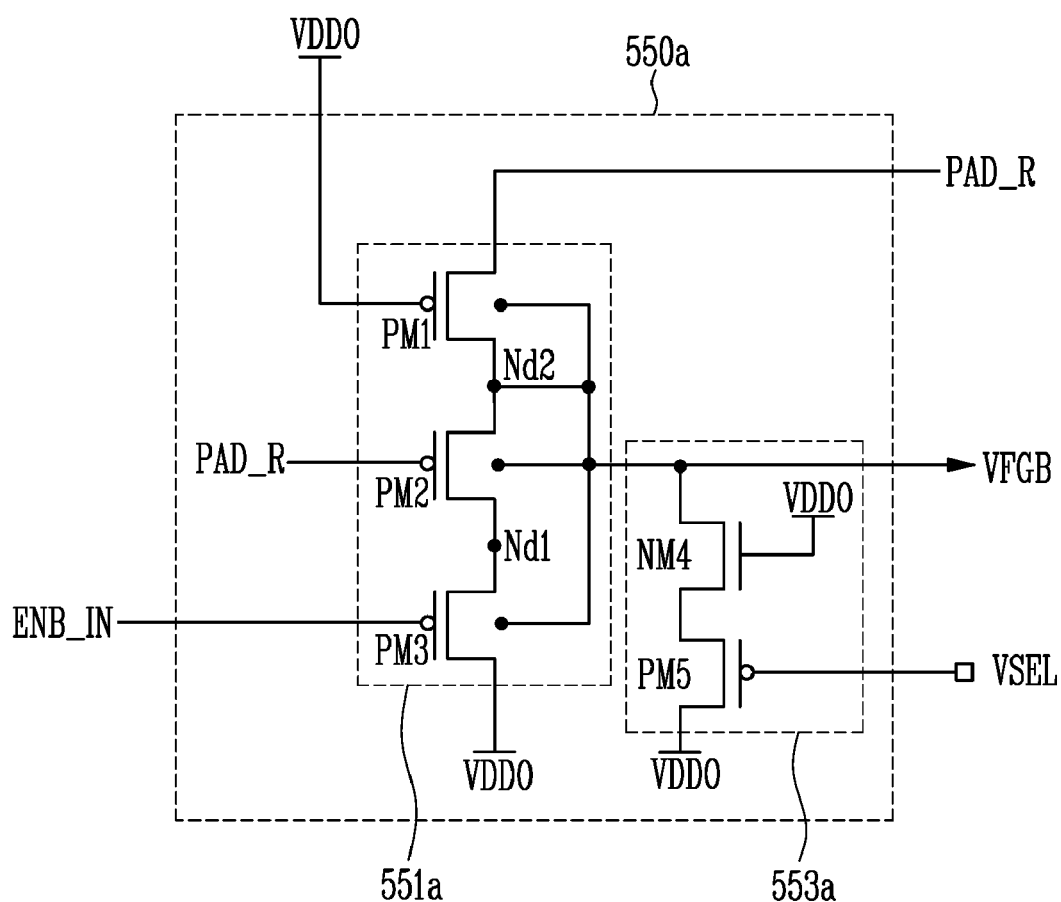
FIG. 15 is a circuit diagram illustrating a gate control logic suitable for use as a gate control logic of FIG. 14 according to an embodiment.

FIG. 15 is a circuit diagram illustrating a gate control logic 550a suitable for use as the gate control logic 550 of FIG. 14 according to an embodiment.

Referring to FIG. 15, the gate control logic 550a includes first, second, and third PMOS transistors PM1, PM2, and PM3 sequentially connected in series between a pad voltage PAD_R and a first power voltage VDDO. A series connection structure of the first, second, and third PMOS transistors PM1, PM2, and PM3 may configure a feedback transistor component 551a. A drain electrode of the first PMOS transistor PM1 and a source electrode of the second PMOS transistor PM2 are connected to a node Nd2. In addition, a drain electrode of the second PMOS transistor PM2 and a source electrode of the third PMOS transistor PM3 are connected to a node Nd1. Meanwhile, the first power voltage VDDO is applied to a gate terminal of the first PMOS transistor PM1, the pad voltage PAD_R is applied to a gate terminal of the second PMOS transistor PM2, and the inverted enable signal ENB_IN is applied to a gate terminal of the third PMOS transistor PM3. In addition, a bulk region voltage of the first, second, and third PMOS transistors PM1, PM2, and PM3 is output as the feedback voltage VFGB.

Meanwhile, a difference between the gate control logic 550a of FIG. 15 and the gate control logic 450a of FIG. 7 is that the gate control logic 550a further includes a fourth NMOS transistor NM4 and a fifth PMOS transistor PM5 sequentially connected in series between an output terminal of the feedback voltage VFGB and the first power voltage VDDO. The fourth NMOS transistor NM4 and the fifth PMOS transistor PM5 may configure an external voltage selector 553a. The first power voltage VDDO is applied to a gate terminal of the fourth NMOS transistor NM4, and the second control signal VSEL is applied to a gate terminal of the fifth PMOS transistor PM5. The disclosed open-drain output structure may operate even in a case where the external high voltage VDDH is 1.8V by the additional fifth PMOS transistor PM5. Meanwhile, when the external high voltage VDDH is 3.3V, the fourth NMOS transistor NM4 causes a drain voltage of the fifth PMOS transistor PM5 to be VDDO−Vth_NM4 (in this case, the drain voltage of the fifth PMOS transistor PM5 becomes about 1.4V), to satisfy a reliability condition of the fifth PMOS transistor PM5.

When the external high voltage VDDH is 3.3V, the gate control logic 550a shown in FIG. 15 operates identically to the gate control logic 450a shown in FIG. 7. When the external voltage VDDH is 1.8V, the feedback voltage VFGB is maintained between VDDO−Vth_NM4 and 1.8V (that is, 1.4V≤VFGB≤1.8V). That is, an open-drain output structure that is more flexible than the external voltage selector 553a may be used.

Figure 16:
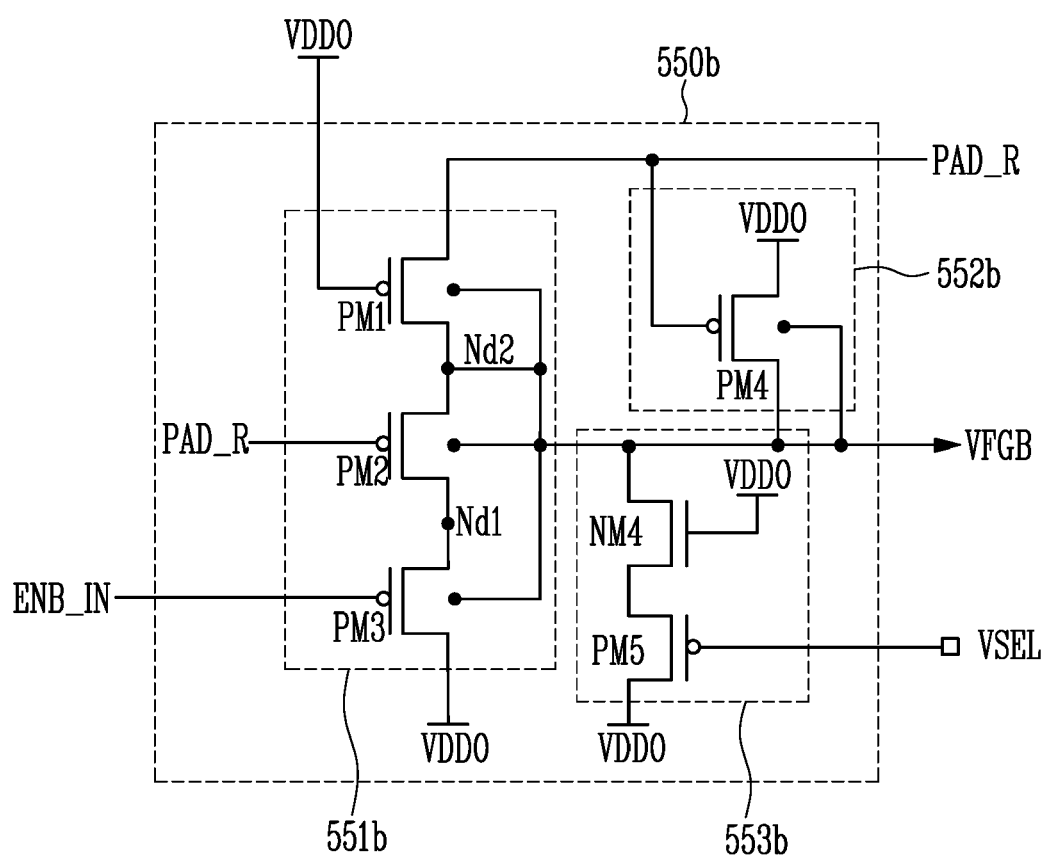
FIG. 16 is a circuit diagram illustrating a gate control logic suitable for use as the gate control logic of FIG. 14 according to another embodiment.

FIG. 16 is a circuit diagram illustrating a gate control logic 550b suitable for use as the gate control logic 550 of FIG. 14 according to another embodiment.

A configuration of the gate control logic 550b shown in FIG. 16 is similar to that of the gate control logic 550a shown in FIG. 15, and includes a feedback transistor component 551b and an external voltage selector 553b. A difference is that the gate control logic 550b of FIG. 16 further includes the fourth PMOS transistor PM4 as shown in FIG. 11, that is, the voltage stabilizer 552b. As described above with reference to FIG. 13, a more stable feedback voltage VFGB may be formed by adding the fourth PMOS transistor PM4.

FIG. 17 is a waveform diagram illustrating an operation of the output driving circuit 500 of FIG. 14 when the external high voltage VDDH is 1.8V. Referring to FIG. 17, the voltage of the pad PAD may increase to a fourth level V4. In an embodiment, the fourth level V4 may be 1.8V. As shown in FIG. 17, when the output driving circuit 500 is configured as shown in FIGS. 14 and 15, a reliability condition of an element may be properly satisfied even though the external high voltage VDDH is the fourth level V4, that is, 1.8V.

However, in a situation in which the first power voltage VDDO has a value of 0V, when the external high voltage VDDH is applied through the pad, a reliability issue of the element may occur. For example, when the first power voltage VDDO is 0V and the external high voltage VDDH exceeding 1.98V is applied to the pad, the voltage of the node A Node A is also 1.98V. At this time, the gate-drain voltage $V_{GD}$ of the second transistor NM2 may exceed 1.98V. Therefore, a reliability condition of the first transistor NM1 may be satisfied, but a reliability condition of the second transistor NM2 may not be satisfied. Therefore, an output driving circuit capable of satisfying the reliability condition of element may be desirable even when the first power voltage VDDO is in an off state, that is, 0V.

Figure 18:
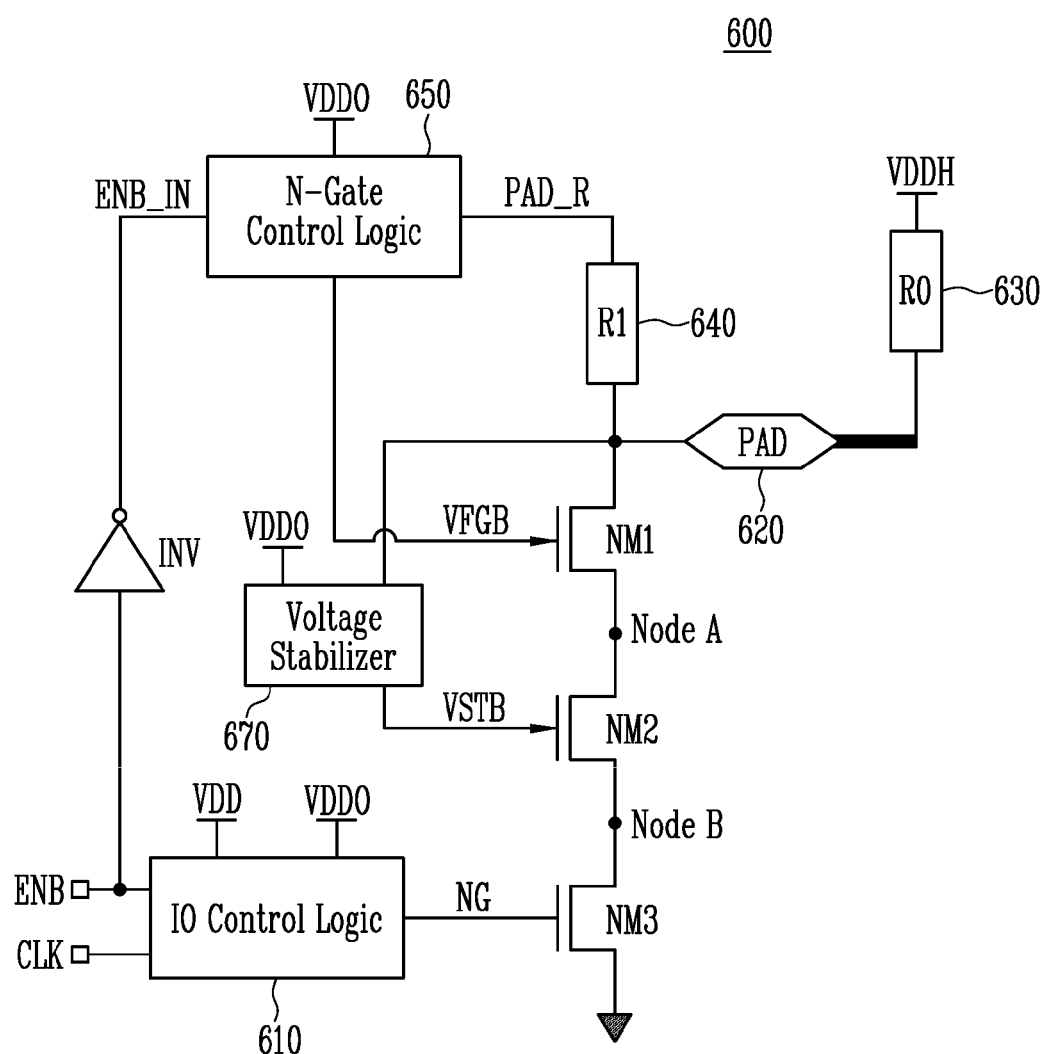
FIG. 18 is a circuit diagram illustrating an output driving circuit according to still another embodiment of the present disclosure.

FIG. 18 is a circuit diagram illustrating an output driving circuit 600 according to still another embodiment of the present disclosure.

Referring to FIG. 18, the output driving circuit 600 according to the still another embodiment of the present disclosure includes first, second, and third transistors NM1, NM2, and NM3, which are sequentially connected in series between a pad 620 and a ground node, an input/output control logic 610, a gate control logic 650, an inverter INV, and a voltage stabilizer 670. The input/output control logic 610 receives a clock signal CLK and an enable signal ENB, and outputs a first control signal NG to the third transistor NM3. The gate control logic 650 receives a voltage PAD_R of the pad 620. In addition, the gate control logic 650 outputs a feedback voltage VFGB to a gate terminal of the first transistor NM1. The inverter INV inverts the enable signal ENB and outputs an inverted enable signal ENB_IN to the gate control logic 650. Meanwhile, the pad 620 is connected to an external high voltage VDDH through an external resistor R0. In addition, the output driving circuit 600 may further include an internal resistor R1 connected between the pad 620 and the gate control logic 650. In an embodiment, the internal resistor R1 may be used as an ESD protection resistor.

The output driving circuit 600 of FIG. 18 may be substantially the same as the output driving circuit 400 of FIG. 6, except that the output driving circuit 600 further includes the voltage stabilizer 670 and the second transistor NM2 receives a stabilization voltage VSTB from the voltage stabilizer 670. Therefore, the gate control logic 650 of FIG. 18 may be implemented as one of the gate control logics 450a of FIG. 7 and the gate control logics 450b of FIG. 11. The voltage stabilizer 670 is connected to the pad 620 to receive a voltage applied to the pad 620, and outputs the stabilization voltage VSTB to a gate terminal of the second transistor NM2.

The stabilization voltage VSTB may be a voltage in a range satisfying a reliability condition of the second transistor NM2. Specifically, the stabilization voltage VSTB may have a value sufficient to make a voltage difference between two terminals of the second transistor NM2 equal to or less than a given value, thereby ensuring reliability of the second transistor NM2. In an embodiment, the stabilization voltage VSTB may be a voltage causing the gate-drain voltage $V_{GD}$ of the second transistor NM2 has a value of 1.98V or less, as shown in Table 1. For example, when a voltage applied through the pad 620 and applied to a drain of the second transistor NM2 through the first transistor is 3.3V, the stabilization voltage VSTB may be a voltage greater than 1.32V and less than 3.3V.

That is, even though the first power voltage VDDO is 0 V, the voltage stabilizer 670 according to an embodiment of the present disclosure may apply the stabilization voltage VSTB having a value of 1.32V or more to the gate terminal of the second transistor NM2. Therefore, the reliability condition of the second transistor NM2 may be satisfied even when a relatively high level (e.g., 3.3 V) of the external high voltage VDDH is applied and the first power voltage VDDO has a relatively low level (e.g., 0V).

Figure 19A:
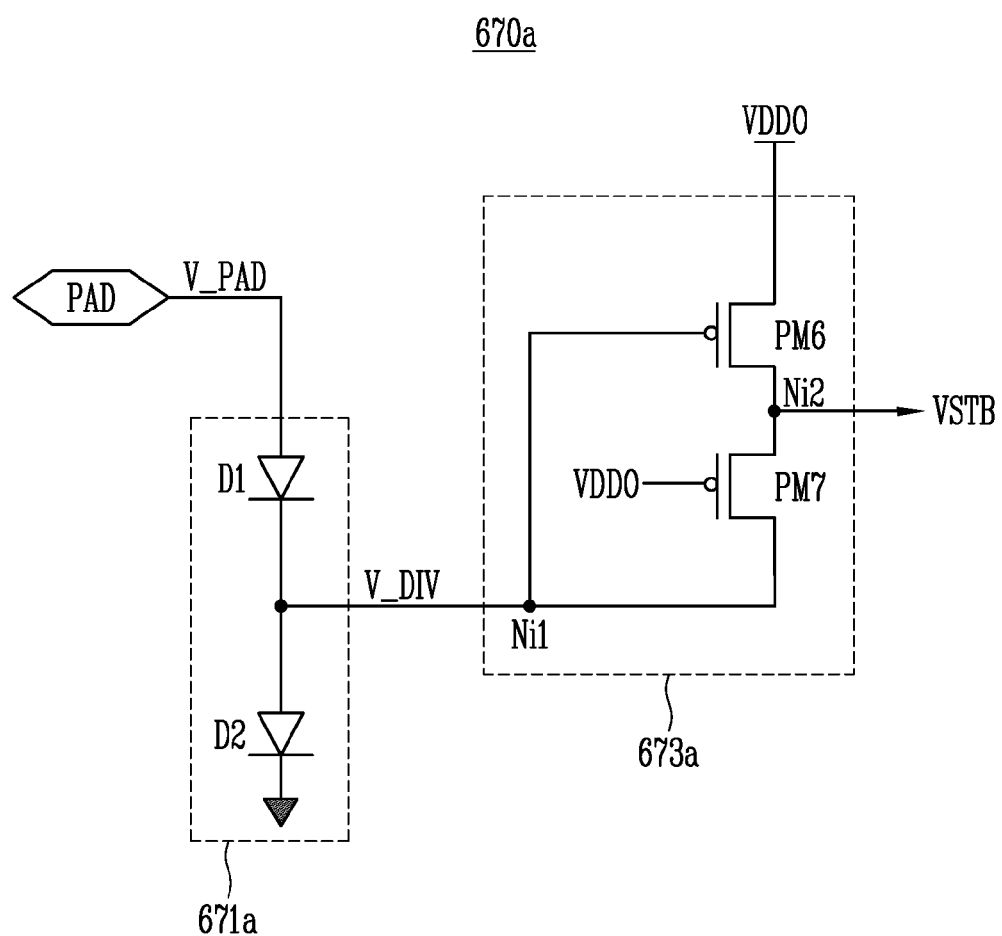
FIG. 19A is a circuit diagram illustrating a voltage stabilizer suitable for use as a voltage stabilizer of FIG. 18 according to an embodiment.

FIG. 19A is a circuit diagram illustrating a voltage stabilizer 670a suitable for use as the voltage stabilizer 670 of FIG. 18, according to an embodiment. Referring to FIG. 19A, the voltage stabilizer 670a according to an embodiment of the present disclosure includes a voltage divider 671a and a stabilization voltage generator 673a.

The voltage divider 671a is connected to a pad (e.g., the pad 620 in FIG. 18), and outputs a division voltage V_DIV generated by dividing a voltage V_PAD applied through the pad, through a first internal node Ni1. In the embodiment of FIG. 19A, the voltage divider 671a includes a first diode D1 and a second diode D2 connected in series between the pad and the ground node. However, embodiments of the present disclosure are not limited thereto, and may be implemented as any type of a division circuit capable of dividing the voltage V_PAD applied through the pad and outputting a division voltage. For example, the voltage divider may include a plurality of resistors connected in series between the pad and the ground node.

In an embodiment, characteristics of the first and second diodes D1 and D2 may be substantially the same. For example, a forward voltage of each of the first and second diodes D1 and D2 may be substantially equal to a half of the voltage V_PAD applied from the pad. In this case, the division voltage V_DIV may have a value corresponding to about a half of the voltage V_PAD applied from the pad. However, embodiments of the present disclosure are not limited thereto, and the voltage divider 671a may be configured so that the division voltage V_DIV has an arbitrary value between the voltage V_PAD applied from the pad and the ground voltage.

The stabilization voltage generator 673a receives the division voltage V_DIV through the first internal node Ni1. In addition, the stabilization voltage generator 673a receives the first power voltage VDDO. In the embodiment of FIG. 19A, the stabilization voltage generator 673a may include a sixth PMOS transistor PM6 and a seventh PMOS transistor PM7 connected in series between the first power voltage VDDO and the first internal node Ni1. The sixth PMOS transistor PM6 is connected between the first power voltage VDDO and a second internal node Nit. A gate terminal of the sixth PMOS transistor PM6 is connected to the first internal node Ni1. The seventh PMOS transistor PM7 is connected between the second internal node Ni2 and the first internal node Ni1. A gate terminal of the seventh PMOS transistor PM7 is connected to the first power voltage VDDO. Meanwhile, the stabilization voltage generator 683a outputs the stabilization voltage VSTB through the second internal node Ni2.

When the first power voltage VDDO is a voltage of 0V, the seventh PMOS transistor PM7 is turned on. Meanwhile, when the voltage V_PAD applied to the pad is a relatively high voltage, for example, 3.3V in a state in which the first power voltage VDDO is 0V, the division voltage V_DIV is about 1.65V. In this case, the division voltage V_DIV may be a voltage that weakly turns on the sixth PMOS transistor PM6. Since the sixth transistor PM6 is weakly turned on and the seventh PMOS transistor PM7 is relatively strongly turned on, the stabilization voltage generator 673a outputs the stabilization voltage VSTB that is substantially equal to the division voltage V_DIV.

In an embodiment, the stabilization voltage VSTB may have a magnitude sufficient to make a difference between voltages at an end terminal (e.g., the drain) of the second transistor NM2 and a control terminal (e.g., the gate) of the second transistor NM2 equal to or less than a given value (e.g., 1.98V) for satisfying the reliability condition of the second transistor NM2. For example, as described above, when the voltage V_PAD applied to the pad is 3.3V, the stabilization voltage VSTB for satisfying the reliability condition of the second transistor NM2 is a voltage (e.g., about 1.65V) greater than 1.32V. Therefore, the voltage divider 671a may divide the pad voltage of 3.3V, and output a voltage greater than 1.32V as the division voltage V_DIV. In this case, the reliability condition of the second transistor NM2 may be satisfied even though the external high voltage VDDH of 3.3V is applied through the pad in a state in which the first power voltage VDDO is 0V.

When the first power voltage VDDO is a voltage (for example, 1.8V) of a normal state other than 0V, the seventh PMOS transistor PM7 is turned off. For example, when the first power voltage VDDO is about 1.8V, the first power voltage VDDO may be in a range of 1.7V to 1.9V, 1.75V to 1.85V, 1.77V to 1.83V, or 1.79V to 1.81V. Meanwhile, when the voltage V_PAD applied to the pad is a high voltage, for example, 3.3V, the division voltage V_DIV becomes about 1.65V. In this case, the division voltage V_DIV may be a voltage that weakly turns on the sixth PMOS transistor PM6. Since the sixth transistor PM6 is weakly turned on and the seventh PMOS transistor PM7 is turned off, the stabilization voltage VSTB output through the second internal node Nit may be substantially equal to the first power voltage VDDO of the normal state. However, in this case, since the sixth PMOS transistor PM6 is weakly turned on, the stabilization voltage VSTB may increase somewhat slowly to reach the first power voltage VDDO.

Figure 19B:
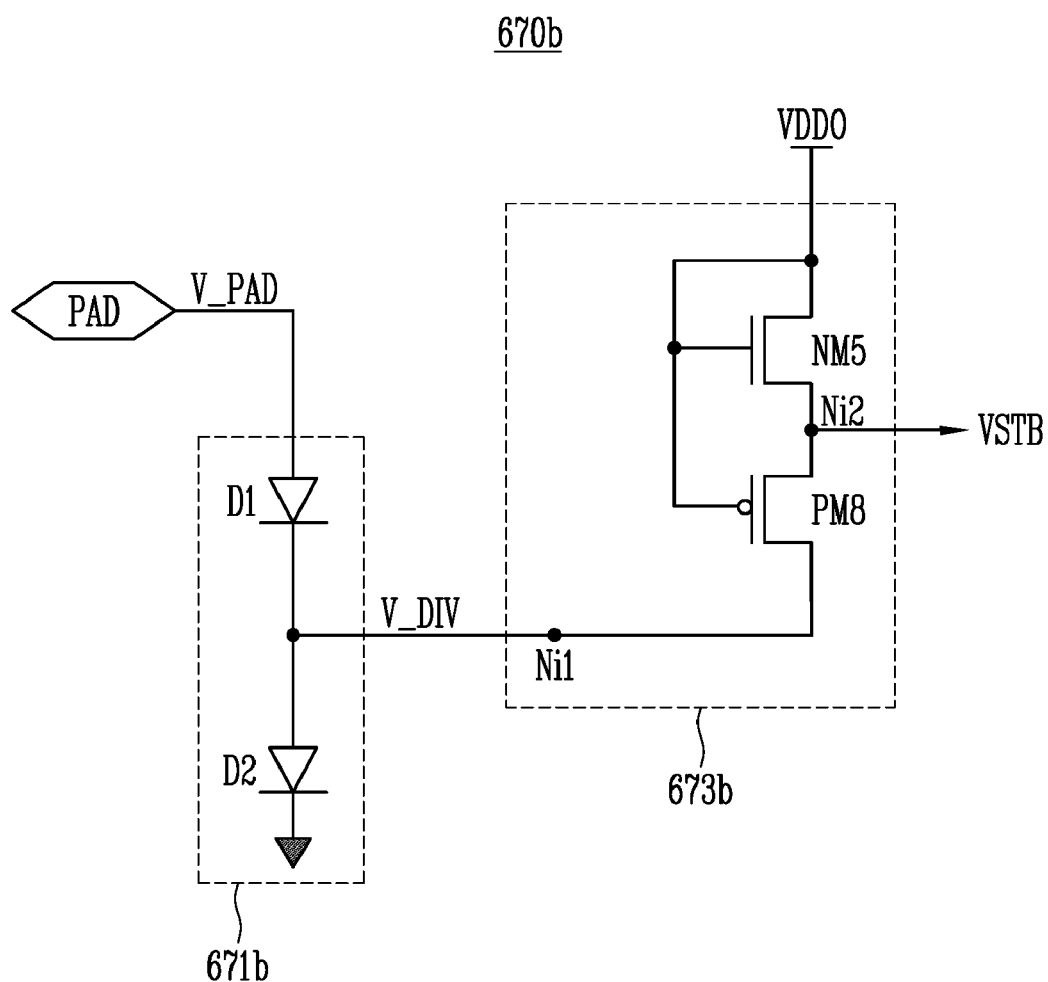
FIGS. 19B, 19C, 19D, 19E, 19F, 19G, 19H, and 19I are circuit diagrams each illustrating a voltage stabilizer suitable for use as the voltage stabilizer of FIG. 18 according to an embodiment.

FIG. 19B is a circuit diagram illustrating a voltage stabilizer 670b suitable for use as the voltage stabilizer 670 of FIG. 18, according to another embodiment. Referring to FIG. 19B, the voltage stabilizer 670b according to another embodiment of the present disclosure includes a voltage divider 671b and a stabilization voltage generator 673b. The voltage divider 671b of FIG. 19B may be substantially the same as the voltage divider 671a of FIG. 19A. Therefore, repetitive description of the voltage divider 671b is omitted.

The stabilization voltage generator 673b receives the division voltage V_DIV through the first internal node Ni1. In addition, the stabilization voltage generator 673b receives the first power voltage VDDO. In the embodiment of FIG. 19B, the stabilization voltage generator 673b may include a fifth NMOS transistor NM5 and an eighth PMOS transistor PM8 connected in series between the first power voltage VDDO and the first internal node Ni1. The fifth NMOS transistor NM5 is connected between the first power voltage VDDO and the second internal node Ni2. A gate terminal of the fifth NMOS transistor NM5 is connected to the first power voltage VDDO. The eighth PMOS transistor PM8 is connected between the second internal node Ni2 and the first internal node Ni1. A gate terminal of the eighth PMOS transistor PM8 is connected to the first power voltage VDDO. Meanwhile, the stabilization voltage generator 673b outputs the stabilization voltage VSTB through the second internal node Ni2.

When the first power voltage VDDO is a voltage of 0V, the fifth NMOS transistor NM5 is turned off, and the eighth PMOS transistor PM8 is turned on. Therefore, in this case, the stabilization voltage generator 673b outputs the division voltage V_DIV as the stabilization voltage VSTB to the gate terminal of the second transistor NM2.

When the first power voltage VDDO is a voltage (for example, 1.8 V) of a normal state other than 0V, the fifth NMOS transistor NM5 is turned on, and the eighth PMOS transistor PM8 is turned off. Therefore, in this case, the stabilization voltage generator 673b outputs the first power voltage VDDO as the stabilization voltage VSTB to the gate terminal of the second transistor NM2 of FIG. 18.

In a case of the stabilization voltage generator 673a of FIG. 19A, since the sixth PMOS transistor PM6 is weakly turned on when the first power voltage VDDO is the voltage of the normal state other than 0V, the stabilization voltage VSTB may increase somewhat slowly to a voltage level of the first power voltage VDDO. In comparison with this, in a case of the stabilization voltage generator 673b of FIG. 19B, the fifth NMOS transistor NM5 turned on by the first power voltage VDDO may quickly increase the stabilization voltage VSTB to a voltage level of the first power voltage VDDO.

Figure 19C:
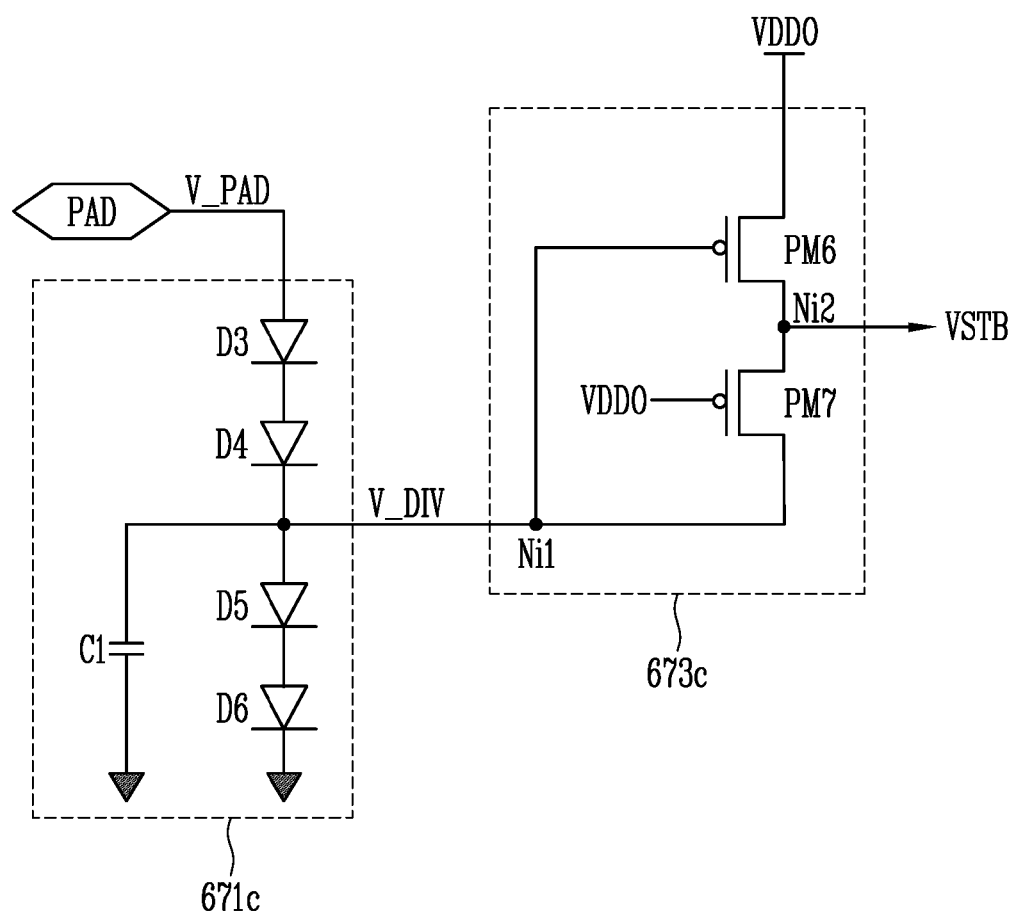

FIG. 19C is a circuit diagram illustrating a voltage stabilizer 670c suitable for used as the voltage stabilizer 670 of FIG. 18, according to another embodiment. Referring to FIG. 19C, the voltage stabilizer 670c according to another embodiment of the present disclosure includes a voltage divider 671c and a stabilization voltage generator 673c. The stabilization voltage generator 673c of FIG. 19C may be substantially the same as the stabilization voltage generator 673a of FIG. 19A. Therefore, repetitive description of the stabilization voltage generator 673c is omitted.

Referring to FIG. 19C, the voltage divider 671c is connected to the pad, and outputs the division voltage V_DIV generated by dividing the voltage V_PAD applied through the pad, through the first internal node Ni1. Differently from the voltage divider 671a of FIG. 19A, which includes the two diodes D1 and D2, in the embodiment of FIG. 19C, the voltage divider 671c includes third to sixth diodes D3 to D6 connected in series between the pad and the ground node. According to a size of the diode and an application voltage, the number of diodes included in the voltage divider 671c may be variously determined. For example, assuming that the same level (e.g., 3.3V) of the voltage can be applied to the pad, each of the third to sixth diodes D3 to D6 in FIG. 19C may have a size such that its forward voltage is about a half of that of each of the first and second diodes D1 and D2 in FIG. 19A, thereby making a voltage drop across the third and fourth diodes D3 and D4 of FIG. 19C substantially equal to that across the first diode D1 of FIG. 19A and making a voltage drop across the fifth and sixth diodes D5 and D6 of FIG. 19C substantially equal to that across the second diode D2 of FIG. 19A. Meanwhile, in FIG. 19C, the number of diodes D3 and D4 connected between the pad and the first internal node Ni1 and the number of diodes D5 and D6 connected between the first internal node Ni1 and the ground are the same. However, embodiments of the present disclosure are not limited thereto, and different numbers of diodes may be connected between the pad and the first internal node Ni1 and between the first internal node Ni1 and the ground.

Meanwhile, the voltage divider 671c shown in FIG. 19C may further include a capacitor C1 connected between the first internal node Ni1 and the ground. That is, the capacitor C1 is connected to the fifth and sixth diodes D5 and D6 in parallel. The division voltage V_DIV output through the first internal node Ni1 may be stably maintained by the capacitor C1 connected between the first internal node Ni1 and the ground.

Figure 19D:
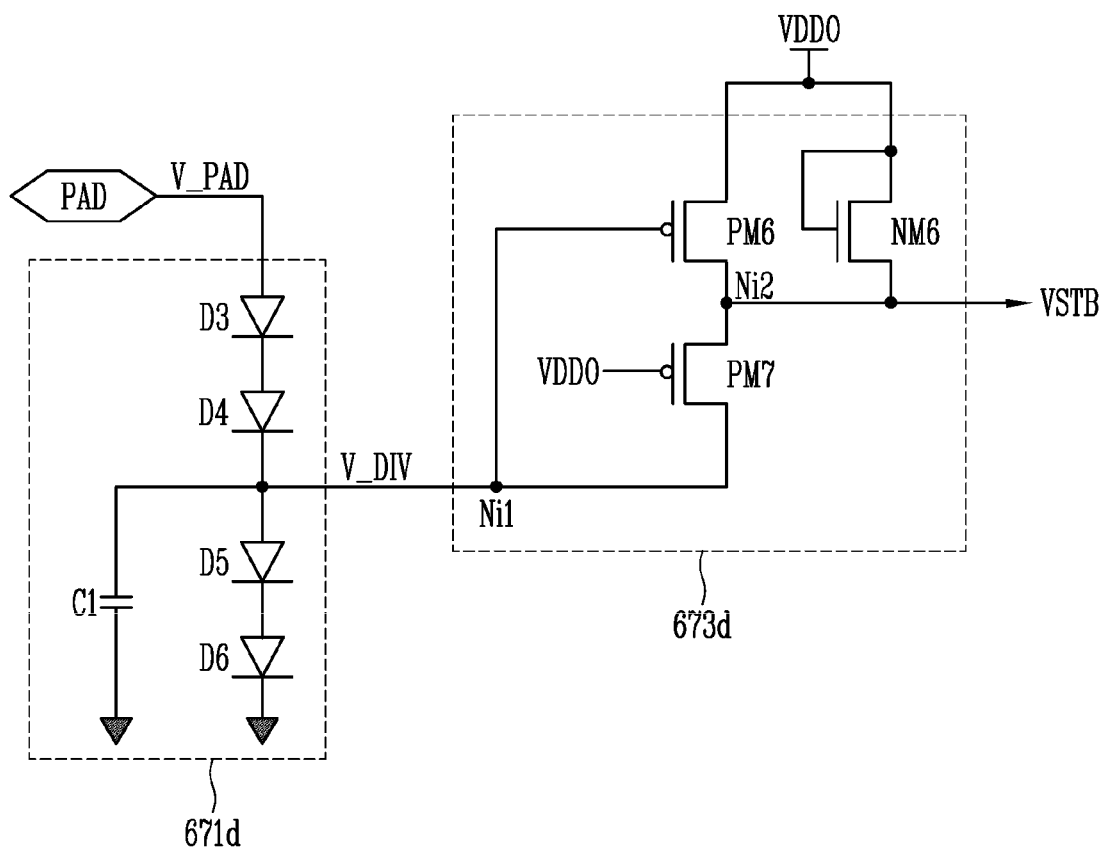

FIG. 19D is a circuit diagram illustrating a voltage stabilizer 670d suitable for used as the voltage stabilizer 670 of FIG. 18, according to another embodiment. Referring to FIG. 19D, the voltage stabilizer 670d according to another embodiment of the present disclosure includes a voltage divider 671d and a stabilization voltage generator 673d. The voltage divider 671d of FIG. 19D may be substantially the same as the voltage divider 671c of FIG. 19C. Therefore, repetitive description of the voltage divider 671d is omitted.

The stabilization voltage generator 673d receives the division voltage V_DIV through the first internal node Ni1. In addition, the stabilization voltage generator 673d receives the first power voltage VDDO. In the embodiment of FIG. 19D, the stabilization voltage generator 673d may include a sixth PMOS transistor PM6 and a seventh PMOS transistor PM7 connected in series between the first power voltage VDDO and the first internal node Ni1, and a sixth NMOS transistor NM6 connected between the first power voltage VDDO and the second internal node Ni2. The sixth PMOS transistor PM6 is connected between the first power voltage VDDO and the second internal node Ni2. A gate terminal of the sixth PMOS transistor PM6 is connected to the first internal node Ni1. The seventh PMOS transistor PM7 is connected between the second internal node Ni2 and the first internal node Ni1. A gate terminal of the seventh PMOS transistor PM7 is connected to the first power voltage VDDO. A gate terminal of the sixth NMOS transistor NM6 is connected to the first power voltage VDDO. Meanwhile, the stabilization voltage generator 673d outputs the stabilization voltage VSTB through the second internal node Ni2.

Comparing FIGS. 19C and 19D, the stabilization voltage generator 673d of FIG. 19D is substantially the same as the stabilization voltage generator 673c of FIG. 19C except that the stabilization voltage generator 673d further includes the sixth NMOS transistor NM6 connected between the first power voltage VDDO and the second internal node Ni2.

When the first power voltage VDDO is a voltage of 0V, the seventh PMOS transistor PM7 is turned on and the sixth NMOS transistor NM6 is turned off. Meanwhile, when the voltage V_PAD applied to the pad is a high voltage, for example, 3.3V in a state in which the first power voltage VDDO is 0V, the division voltage V_DIV is about 1.65V. In this case, the division voltage V_DIV may be a voltage that weakly turns on the sixth PMOS transistor PM6. Since the sixth transistor PM6 is weakly turned on and the seventh PMOS transistor PM7 is relatively strongly turned on, the stabilization voltage generator 673d outputs the stabilization voltage VSTB that is substantially equal to the division voltage V_DIV.

As described above, when the voltage V_PAD applied to the pad is 3.3V, the stabilization voltage VSTB for satisfying the reliability condition of the second transistor NM2 of FIG. 18 is a voltage greater than 1.32V. Therefore, the voltage divider 671d may divide the pad voltage of 3.3V, and output a voltage greater than 1.32V as the division voltage V_DIV. In this case, the reliability condition of the second transistor NM2 may be satisfied even though the external high voltage VDDH of 3.3V is applied through the pad in a state in which the first power voltage VDDO is 0V.

When the first power voltage VDDO is a voltage (for example, 1.8 V) of a normal state other than 0V, the seventh PMOS transistor PM7 is turned off and the sixth NMOS transistor NM6 is turned on. Meanwhile, when the voltage V_PAD applied to the pad is a relatively high voltage, for example, 3.3V, the division voltage V_DIV is about 1.65V. In this case, the division voltage V_DIV may be a voltage that weakly turns on the sixth PMOS transistor PM6. Since the sixth transistor PM6 is weakly turned on and the sixth NMOS transistor NM6 is relatively strongly turned on in a state in which the seventh PMOS transistor is turned off, the stabilization voltage VSTB output through the second internal node Nit may be substantially equal to the first power voltage VDDO of the normal state.

In a case of each of the stabilization voltage generators 673a of FIG. 19A and 673c of FIG. 19C, since the sixth PMOS transistor PM6 is weakly turned on when the first power voltage VDDO is the voltage of the normal state other than 0V, the stabilization voltage VSTB may increase somewhat slowly to a level of the first power voltage VDDO. In comparison with this, in a case of the stabilization voltage generator 673d of FIG. 19D, the sixth NMOS transistor NM6 turned on by the first power voltage VDDO may quickly increase the stabilization voltage VSTB to the voltage level of the first power voltage VDDO.

Figure 19E:
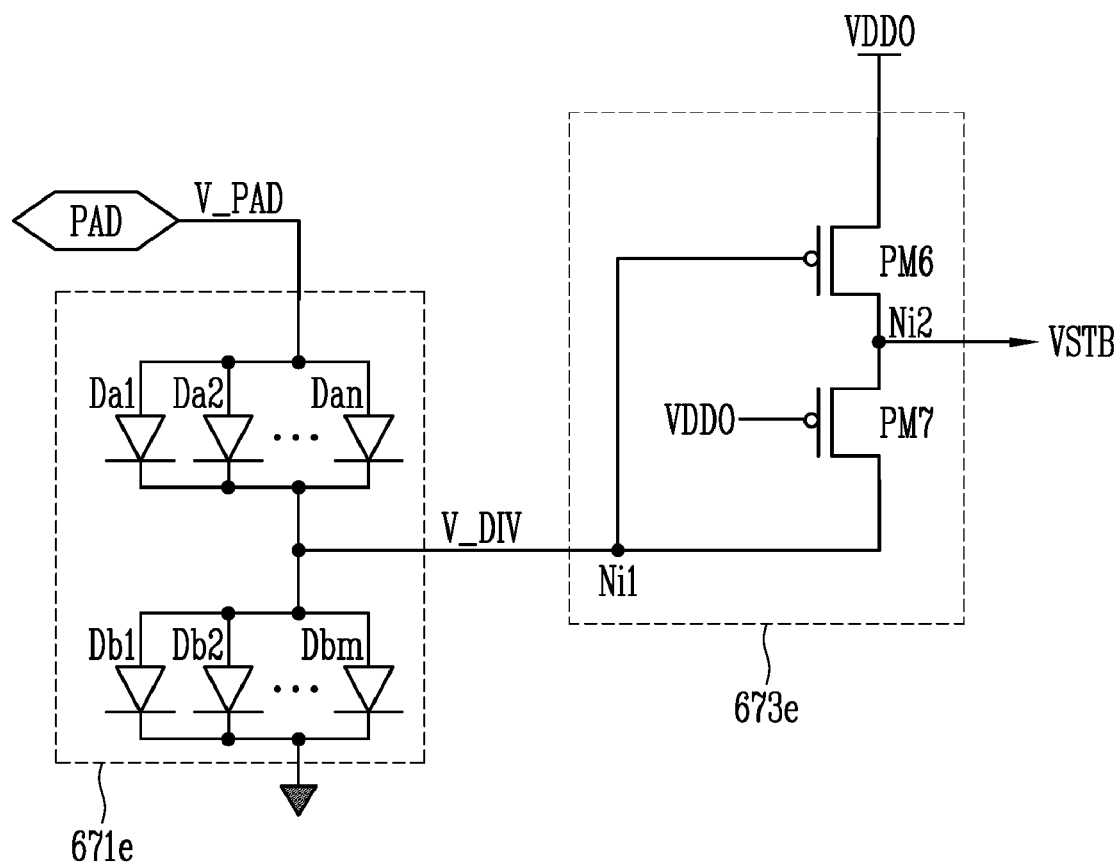

FIG. 19E is a circuit diagram illustrating a voltage stabilizer 670e suitable for use as the voltage stabilizer 670 of FIG. 18, according to another embodiment. Referring to FIG. 19E, the voltage stabilizer 670e according to another embodiment of the present disclosure includes a voltage divider 671e and a stabilization voltage generator 673e. The stabilization voltage generator 673e of FIG. 19E may be substantially the same as the stabilization voltage generator 673a of FIG. 19A. Therefore, repetitive description of the stabilization voltage generator 673e is omitted.

The voltage divider 671e is connected to the pad, and outputs the division voltage V_DIV generated by dividing the voltage V_PAD applied through the pad, through the first internal node Ni1. In the embodiment of FIG. 19E, the voltage divider 671e may include n first diodes Da1, Da2, . . . , and Dan connected in parallel between the pad and the first internal node Ni1 and m second diodes Db1, Db2, . . . , and Dbm connected in parallel between the first internal node Ni1 and the ground node. The number n of the first diodes Da1 to Dan and the number m of the second diodes Db1 to Dbm are natural numbers, and may be the same number or different numbers. When n and m have a value of 1, the voltage divider 671e of FIG. 19E may be substantially the same as the voltage divider 671a of FIG. 19A. According to embodiments of the present disclosure, n and m may be arbitrary natural numbers.

In the embodiment of FIG. 19E, the stabilization voltage generator 673e is substantially the same as the stabilization voltage generator 673a of FIG. 19A. However, embodiments of the present disclosure are not limited thereto, and the voltage stabilizer 670e of FIG. 19E may include the stabilization voltage generator 673b of FIG. 19B or the stabilization voltage generator 673d of FIG. 19D, rather than the stabilization voltage generator 673e.

Figure 19F:
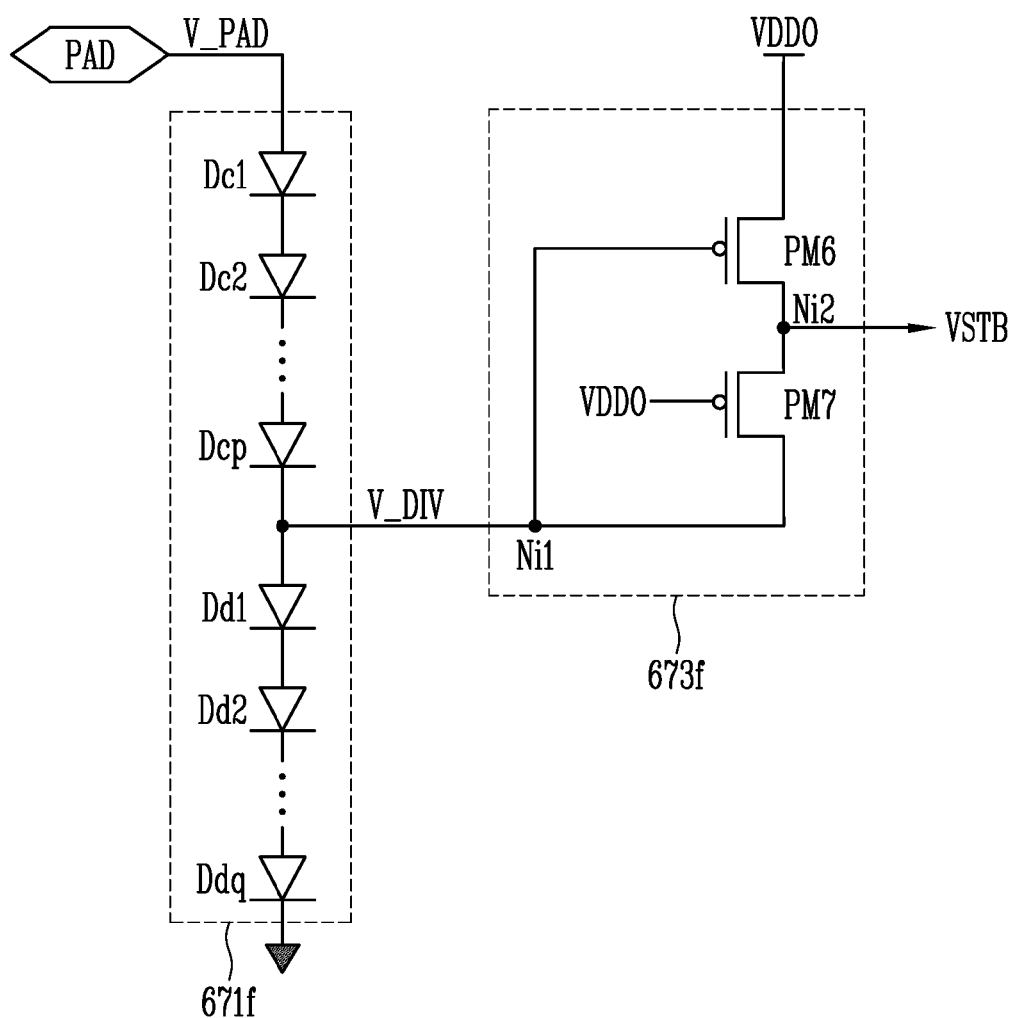

FIG. 19F is a circuit diagram illustrating a voltage stabilizer 670f suitable for used as the voltage stabilizer 670 of FIG. 18, according to another embodiment. Referring to FIG. 19F, the voltage stabilizer 670f according to another embodiment of the present disclosure includes a voltage divider 671f and a stabilization voltage generator 673f. The stabilization voltage generator 673f of FIG. 19F may be substantially the same as the stabilization voltage generator 673a of FIG. 19A. Therefore, repetitive description of the stabilization voltage generator 673f is omitted.

The voltage divider 671f is connected to the pad, and outputs the division voltage V_DIV generated by dividing the voltage V_PAD applied through the pad, through the first internal node Ni1. In the embodiment of FIG. 19F, the voltage divider 671f may include p first diodes Dc1, Dc2, . . . , and Dcp connected in series between the pad and the first internal node Ni1 and q second diodes Dd1, Dd2, . . . , and Ddq connected in parallel between the first internal node Ni1 and the ground node. The number p of the first diodes Dc1 to Dcp and the number q of the second diodes Dd1 to Ddq are natural numbers, and may be the same number or different numbers. When p and q have a value of 1, the voltage divider 671f of FIG. 19F may be substantially the same as the voltage divider 671a of FIG. 19A. According to embodiments of the present disclosure, p and q may be arbitrary natural numbers.

In the embodiment of FIG. 19F, the stabilization voltage generator 673f is substantially the same as the stabilization voltage generator 673a of FIG. 19A. However, embodiments of the present disclosure are not limited thereto, and the voltage stabilizer 670f of FIG. 19F may include the stabilization voltage generator 673b of FIG. 19B or the stabilization voltage generator 673d of FIG. 19D, rather than the stabilization voltage generator 673f.

Figure 19G:
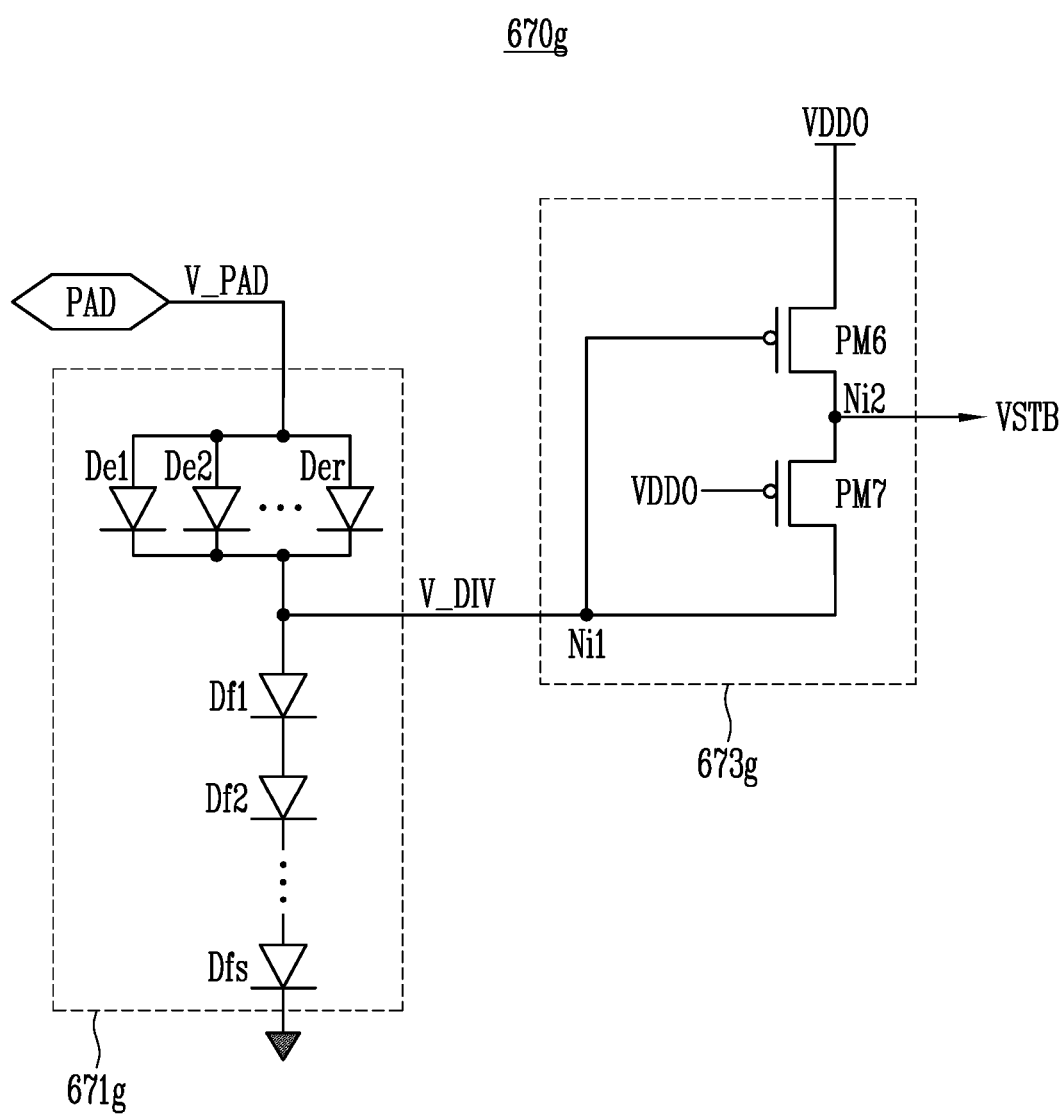

FIG. 19G is a circuit diagram illustrating a stabilization voltage generator 670g suitable for use as the voltage stabilizer 670 of FIG. 18, according to another embodiment of the present disclosure. Referring to FIG. 19G, the voltage stabilizer 670g includes a voltage divider 671g and a stabilization voltage generator 673g. The stabilization voltage generator 673g of FIG. 19G may be substantially the same as the stabilization voltage generator 673a of FIG. 19A. Therefore, repetitive description of the stabilization voltage generator 673g is omitted.

The voltage divider 671g is connected to the pad, and outputs the division voltage V_DIV generated by dividing the voltage V_PAD applied through the pad, through the first internal node Ni1. In the embodiment of FIG. 19G, the voltage divider 671g may include r first diodes De1, De2, . . . , and Der connected in parallel between the pad and the first internal node Ni1 and s second diodes Df1, Df2, . . . , and Dfs connected in series between the first internal node Ni1 and the ground node. The number r of the first diodes De1 to Der and the number s of the second diodes Df1 to Dfs are natural numbers, and may be the same number or different numbers. When r and s have a value of 1, the voltage divider 671g of FIG. 19G may be substantially the same as the voltage divider 671a of FIG. 19A. According to embodiments of the present disclosure, r and s may be arbitrary natural numbers.

In the embodiment of FIG. 19G, the stabilization voltage generator 673g is substantially the same as the stabilization voltage generator 673a of FIG. 19A. However, embodiments of the present disclosure are not limited thereto, and the voltage stabilizer 670g of FIG. 19G may include the stabilization voltage generator 673b of FIG. 19B or the stabilization voltage generator 673d of FIG. 19D, rather than the stabilization voltage generator 673g.

Figure 19H:
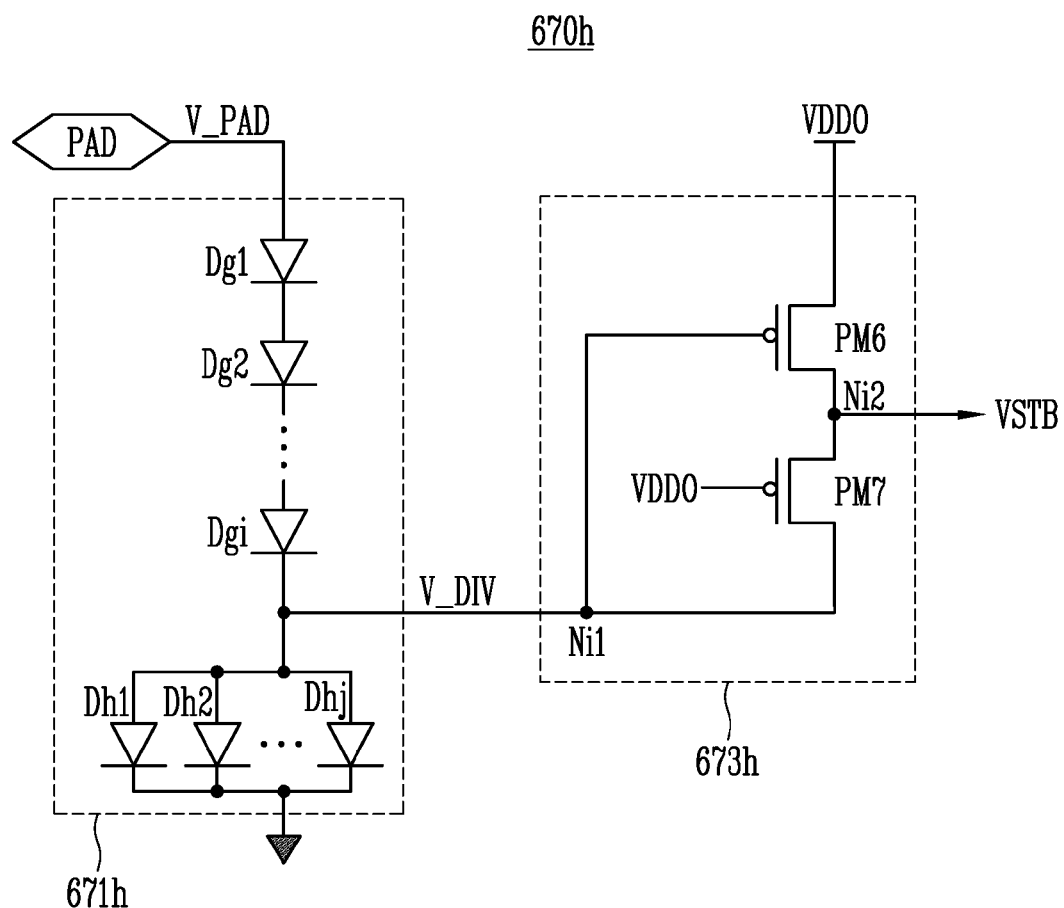

FIG. 19H is a circuit diagram illustrating a voltage stabilizer 670h suitable for use as the voltage stabilizer 670 of FIG. 18, according to another embodiment. Referring to FIG. 19H, the voltage stabilizer 670h according to another embodiment of the present disclosure includes a voltage divider 671h and a stabilization voltage generator 673h. The stabilization voltage generator 673h of FIG. 19H may be substantially the same as the stabilization voltage generator 673a of FIG. 19A. Therefore, repetitive description of the stabilization voltage generator 673h is omitted.

The voltage divider 671h is connected to the pad, and outputs the division voltage V_DIV generated by dividing the voltage V_PAD applied through the pad, through the first internal node Ni1. In the embodiment of FIG. 19H, the voltage divider 671h may include i first diodes Dg1, Dg2, . . . , and Dgi connected in series between the pad and the first internal node Ni1 and j second diodes Dh1, Dh2, . . . , and Dhj connected in parallel between the first internal node Ni1 and the ground node. The number i of the first diodes Dg1 to Dgi and the number j of the second diodes Dh1 to Dhj are natural numbers, and may be the same number or different numbers. When i and j have a value of 1, the voltage divider 671h of FIG. 19H may be substantially the same as the voltage divider 671a of FIG. 19A. According to embodiments of the present disclosure, i and j may be arbitrary natural numbers.

In the embodiment of FIG. 19H, the stabilization voltage generator 673h is substantially the same as the stabilization voltage generator 673a of FIG. 19A. However, embodiments of the present disclosure are not limited thereto, and the voltage stabilizer 670h of FIG. 19H may include the stabilization voltage generator 673b of FIG. 19B or the stabilization voltage generator 673d of FIG. 19D, rather than the stabilization voltage generator 673h.

Figure 19I:
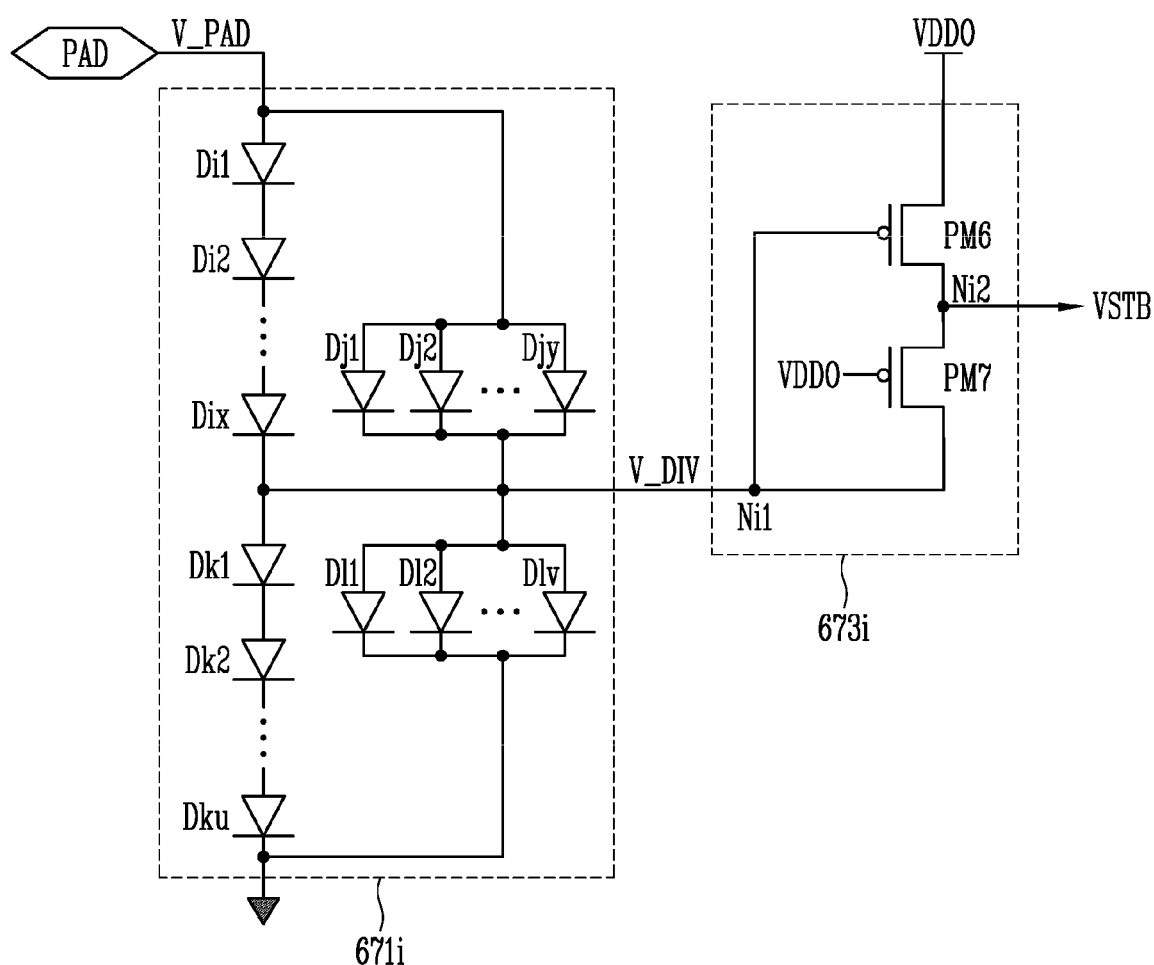

FIG. 19I is a circuit diagram illustrating a voltage stabilizer 670i suitable for use as the voltage stabilizer of FIG. 18, according to another embodiment. Referring to FIG. 19I, the voltage stabilizer 670i according to another embodiment of the present disclosure includes a voltage divider 671i and a stabilization voltage generator 673i. The stabilization voltage generator 673i of FIG. 19I may be substantially the same as the stabilization voltage generator 673a of FIG. 19A. Therefore, repetitive description of the stabilization voltage generator 673i is omitted.

The voltage divider 671i is connected to the pad, and outputs the division voltage V_DIV generated by dividing the voltage V_PAD applied through the pad, through the first internal node Ni1. In the embodiment of FIG. 19I, the voltage divider 671i may include x first diodes Di1, Di2, . . . , and Dix connected in series between the pad and the first internal node Ni1, y second diodes Dj1, Dj2, . . . , and Djy connected in parallel between the pad and the first internal node Ni1, u third diodes Dk1, Dk2, . . . , and Dku connected in series between the first internal node Ni1 and the ground node, and v fourth diodes Dl1, Dl2, . . . , and Dlv connected in parallel between the first internal node Ni1 and the ground node. The numbers x, y, u and v are natural numbers, and may be the same number or different numbers. In the embodiment of FIG. 19I, the stabilization voltage generator 673i is substantially the same as the stabilization voltage generator 673a of FIG. 19A. However, embodiments of the present disclosure are not limited thereto, and the voltage stabilizer 670i of FIG. 19I may include the stabilization voltage generator 673b of FIG. 19B or the stabilization voltage generator 673d of FIG. 19D, rather than the stabilization voltage generator 673i.

Figure 20:
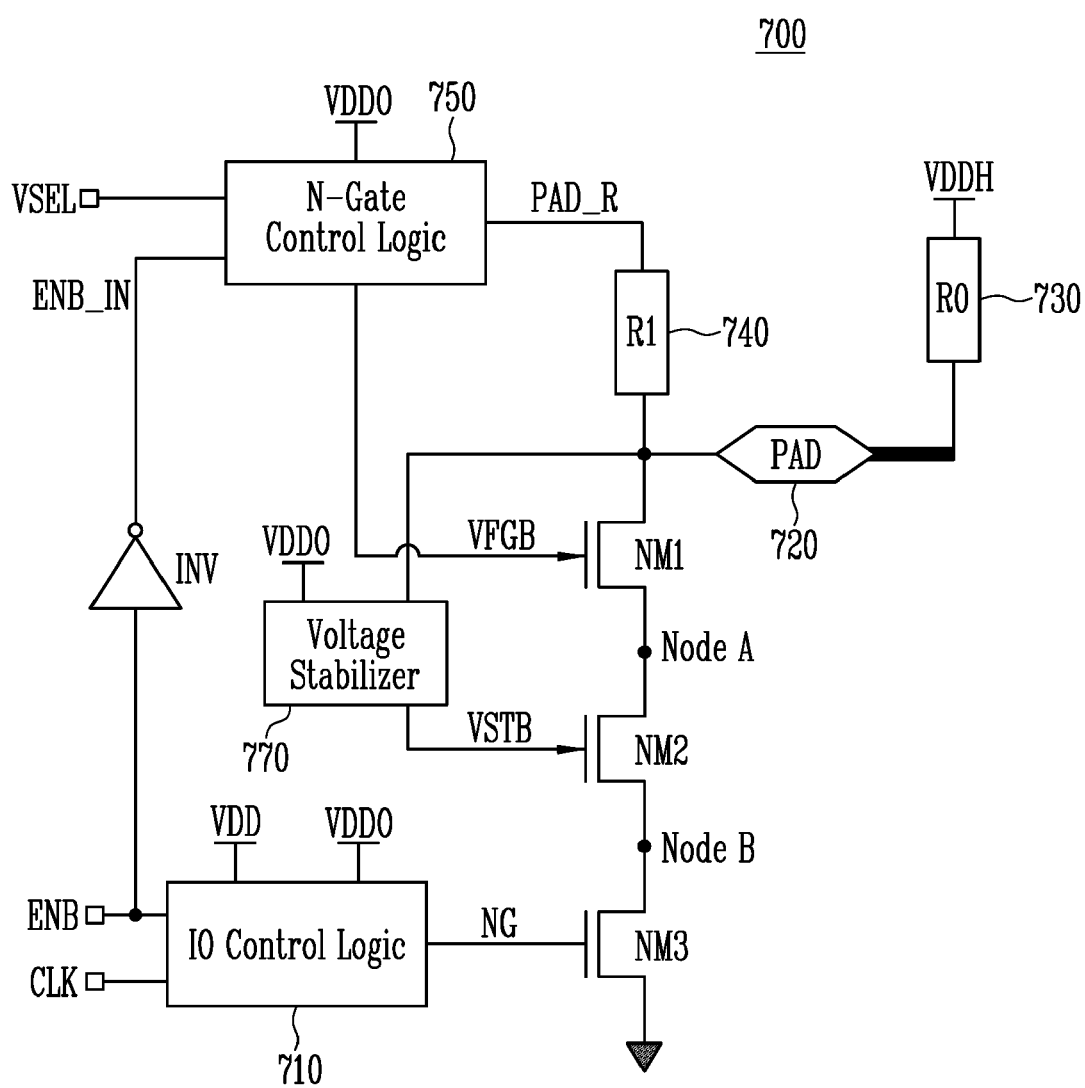
FIG. 20 is a circuit diagram illustrating an output driving circuit according to another embodiment of the present disclosure.

FIG. 20 is a circuit diagram illustrating an output driving circuit 700 according to another embodiment of the present disclosure.

Referring to FIG. 20, the output driving circuit 700 according to an embodiment of the present disclosure includes first, second, and third transistors NM1, NM2, and NM3, which are sequentially connected in series between a pad 720 and a ground node, an input/output control logic 710, a gate control logic 750, an inverter INV, and a voltage stabilizer 770. The input/output control logic 710 receives a clock signal CLK and an enable signal ENB, and outputs a first control signal NG to the third transistor NM3. The gate control logic 750 receives a voltage PAD_R of the pad 720. In addition, the gate control logic 750 outputs a feedback voltage VFGB to a gate terminal of the first transistor NM1. The inverter INV inverts the enable signal ENB and outputs an inverted enable signal ENB_IN to the gate control logic 750. In addition, the gate control logic 750 receives a second control signal VSEL. Meanwhile, the pad 720 is connected to an external high voltage VDDH through an external resistor $R_O$. In addition, the output driving circuit 700 may further include an internal resistor $R_1$ connected between the pad 720 and the gate control logic 750. As described above, the internal resistor $R_1$ may be used as an ESD protection resistor.

The output driving circuit 700 of FIG. 20 may be substantially the same as the output driving circuit 500 of FIG. 14, except that the output driving circuit 700 further includes the voltage stabilizer 770. Meanwhile, a difference between the output driving circuit 700 of FIG. 20 and the output driving circuit 600 of FIG. 18 is that the gate control logic 750 additionally receives the second control signal VSEL. Therefore, the gate control logic 750 of FIG. 20 may be implemented as one of the gate control logics 550a and 550b of FIG. 15 or 16. The voltage stabilizer 770 is connected to the pad 720 to receive a voltage applied to the pad 720, and outputs a stabilization voltage VSTB to the gate terminal of the second transistor NM2. The voltage stabilizer 770 of FIG. 20 may be substantially the same as the voltage stabilizer 670 of FIG. 18. Therefore, the voltage stabilizer 770 of FIG. 20 may be implemented as any one of the voltage stabilizers 670a, 670b, 670c, and 670d respectively shown in FIGS. 19A, 19B, 19C, and 19D.

Figure 21:
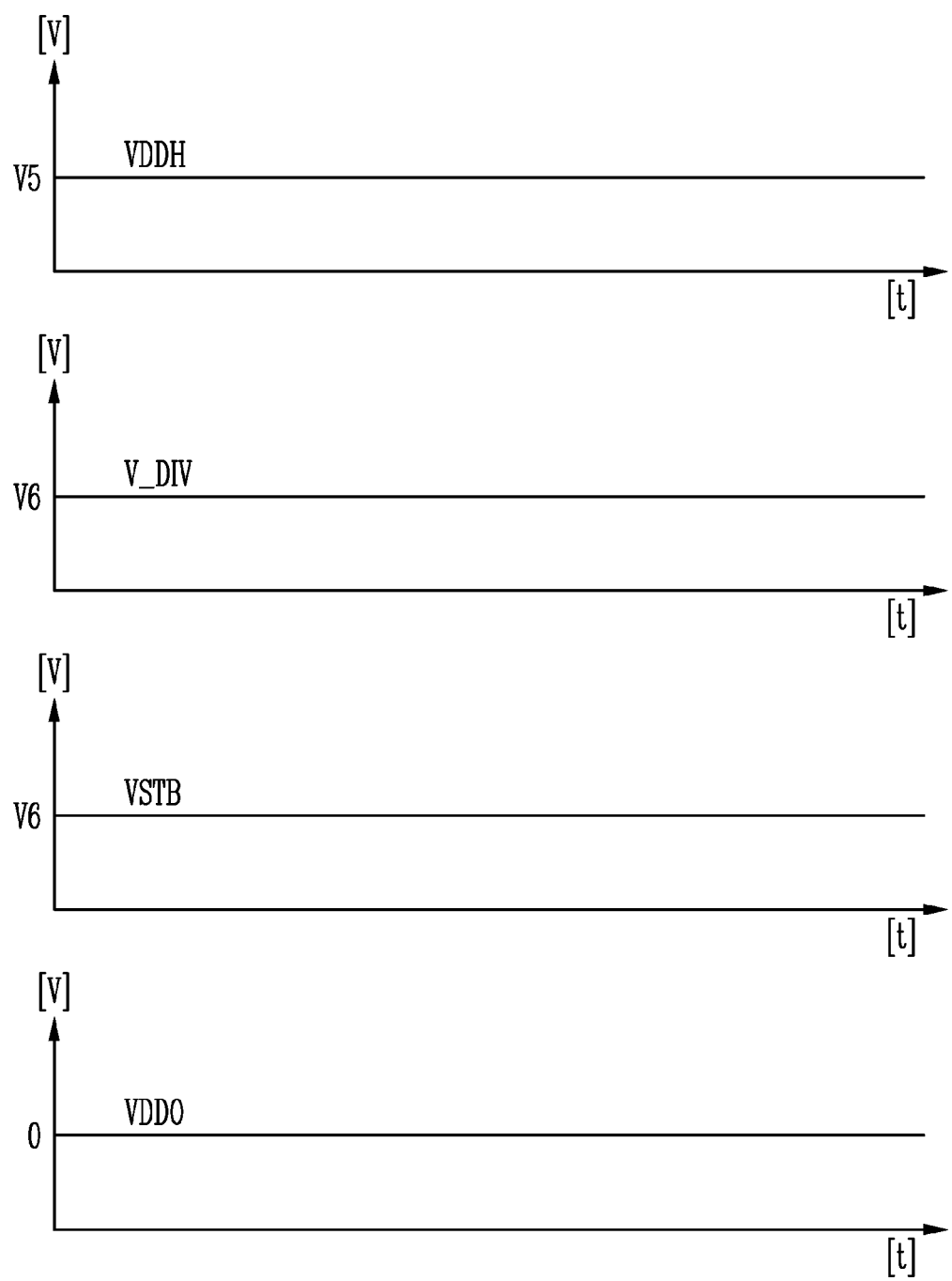
FIGS. 21 and 22 are operation waveform diagrams of the output driving circuit of FIG. 18 when an internal power voltage VDDO is 0V.
Figure 22:
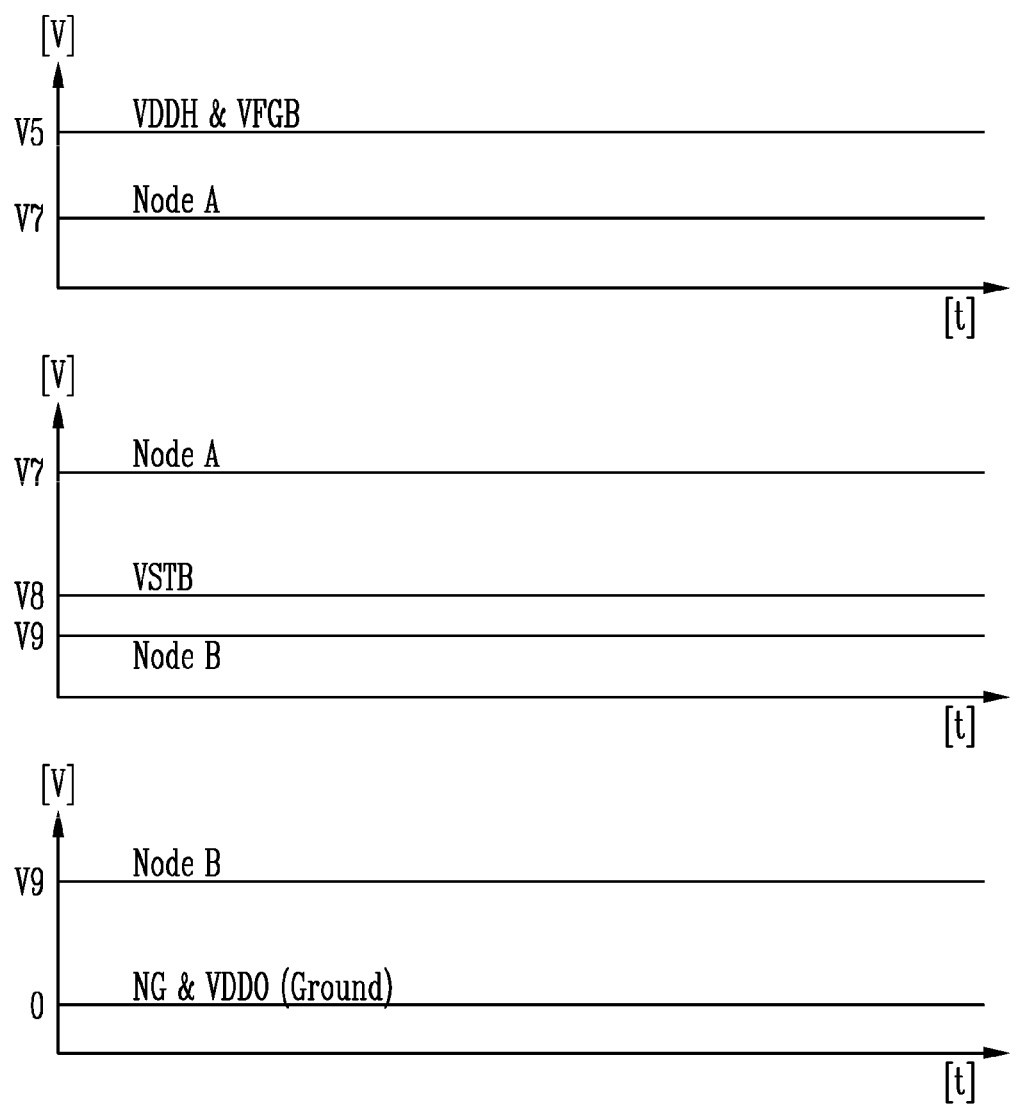

FIGS. 21 and 22 are operation waveform diagrams of the output driving circuit 600 of FIG. 18 when the internal power voltage VDDO is 0V. More specifically, FIGS. 21 and 22 show an operation waveform diagram when the output driving circuit 600 of FIG. 18 includes the voltage stabilizer 670d shown in FIG. 19D.

Referring to FIG. 21, an embodiment in which the external high voltage VDDH applied to the pad is a fifth level V5 is shown. In an embodiment, the fifth level V5 may be 3.3V. FIG. 21 also shows the division voltage V_DIV output to the first internal node Ni1 and the stabilization voltage VSTB output to the second internal node Nit when the external high voltage VDDH applied to the pad is 3.3V and the first power voltage VDDO is 0V. The division voltage V_DIV may have a value of a sixth level V6. For example, the sixth level V6 may be 1.65V, which is a half level of the external high voltage VDDH. In this case, the stabilization voltage VSTB may also be the sixth level V6 equal to the division voltage V_DIV, that is, 1.65V. Accordingly, in a case of the output driving circuit 600 according to an embodiment of the present disclosure, when the first power voltage VDDO is 0V and the external high voltage VDDH applied to the pad is a relatively high fifth level V5, for example, 3.3V, the reliability condition of the second transistor NM2 may be satisfied as will be described below in more detail with reference to FIG. 22.

Referring to FIG. 22, when the external high voltage VDDH applied to the pad is the fifth level V5 and the first power voltage VDDO is 0V, gate voltages, drain voltages, and source voltages of the first to third transistors NM1 to NM3 are shown respectively.

In a case of the first transistor NM1, in a first graph of FIG. 22, the drain voltage is the fifth level V5, which is the external high voltage VDDH applied to the pad, and the gate voltage is the feedback voltage VFGB applied from the gate control logic 650. In this case, the feedback voltage VFGB also has a value of the fifth level V5. The source voltage of the first transistor NM1 is the voltage of the node A Node A, and has a value of a seventh level V7 slightly decreased than the drain voltage. In an embodiment, the external high voltage VDDH, the fifth level V5, which is the external high voltage VDDH, may be 3.3V, and thus the feedback voltage VFGB may also be 3.3V. In this case, the seventh level V7, which is the source voltage of the first transistor NM1, may be about 3.16V, slightly decreased than 3.3V.

Meanwhile, in a case of the second transistor NM2, in a second graph of FIG. 22, the drain voltage may have a value of the seventh level V7, which is the voltage of the node A Node A, and the gate voltage may have an eighth level V8 as the stabilization voltage VSTB applied from the voltage stabilizer 670. When the fifth level V5 which is the external high voltage VDDH is 3.3V, as described above, the seventh level V7 may be 3.16V. In addition, as described above with reference to FIG. 21, the stabilization voltage VSTB may be 1.65V. Meanwhile, the source voltage of the second transistor NM2 may be the voltage of the node B Node B, and may be about a ninth level V9 slightly decreased than the gate voltage. In an embodiment, the ninth level V9 may be 1.53V.

Finally, referring to a last graph of FIG. 22, the drain voltage of the third transistor NM3 may have a value of the ninth level V9 which is the voltage of the node B Node B. In addition, the gate of the third transistor NM3 receives the first control signal NG from the input/output control logic 610. However, since the first power voltage VDDO driving the input/output control logic 510 is 0V, the first control signal NG may also be 0V. Accordingly, in a case of the third transistor NM3, the drain voltage is the ninth level V9, for example, 1.53V, and the gate voltage and the source voltage are 0V.

Referring to FIGS. 21 and 22, when the external high voltage VDDH applied to the pad is 3.3V and the first power voltage VDDO is 0V, all of gate-drain voltages $V_{GD}$, gate-source voltages $V_{GS}$, and drain-source voltages $V_{DS}$ of the first to third transistors NM1 to NM3 may be less than a given value (e.g., 1.98V) for ensuring the reliability of the first to third transistors NMa to NM3. Accordingly, reliability conditions of the first to third transistors NM1 to NM3 are satisfied.

Figure 23:
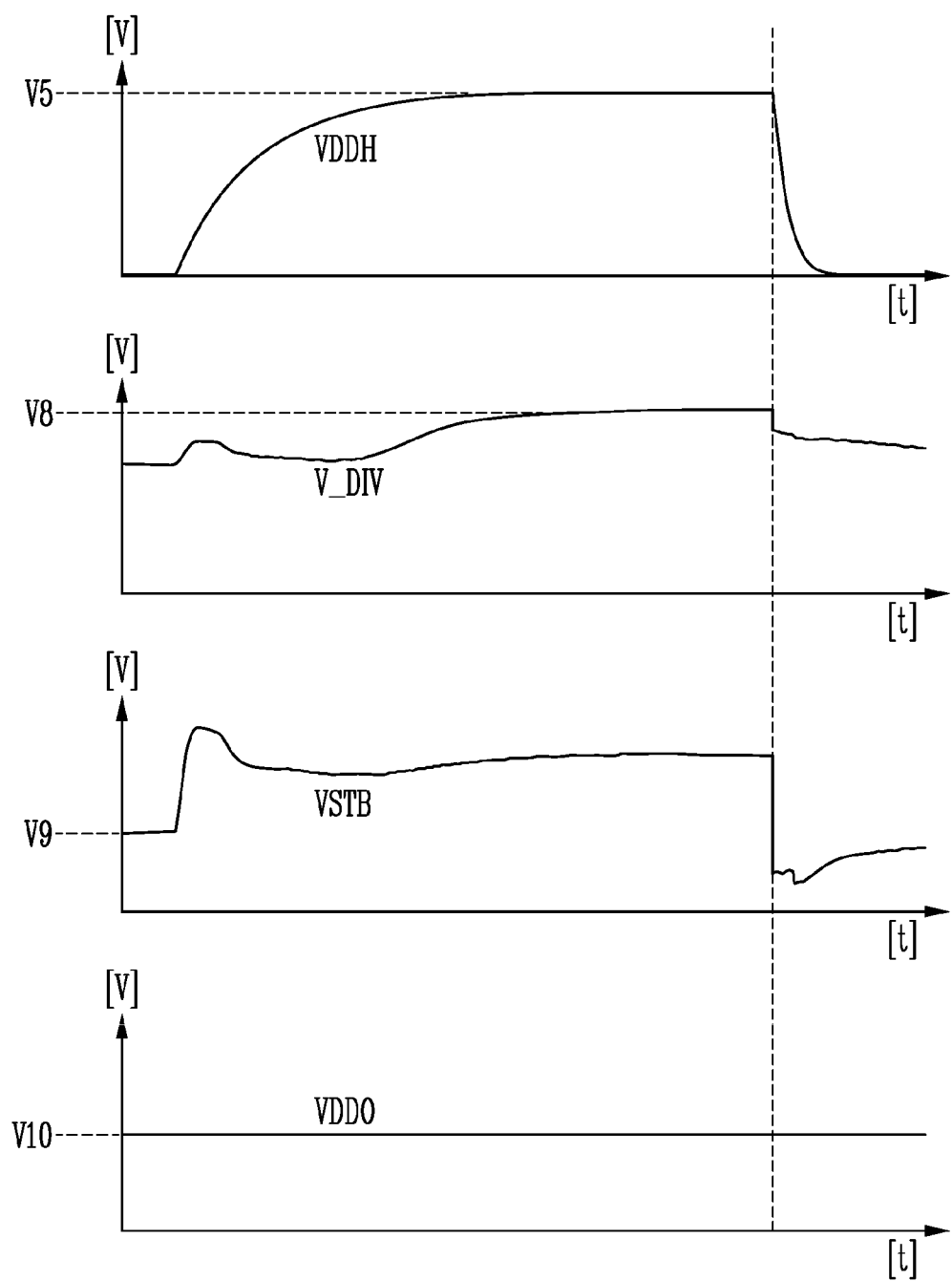
FIGS. 23 and 24 are operation waveform diagrams of the output driving circuit of FIG. 18 when the internal power voltage VDDO is a tenth level V10.
Figure 24:
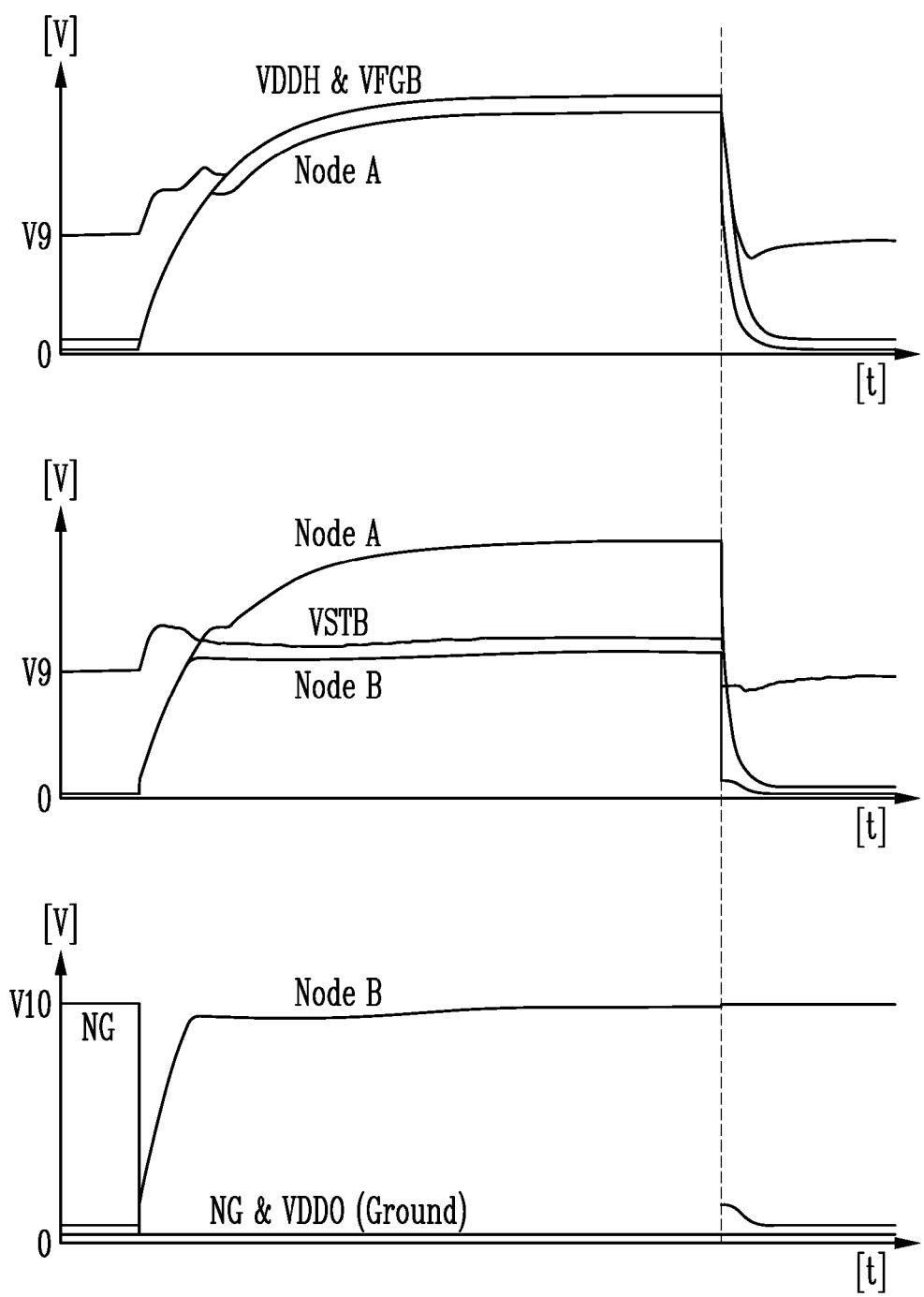

FIGS. 23 and 24 are operation waveform diagrams of the output driving circuit 600 of FIG. 18 when the internal power voltage VDDO is a tenth level V10. In an embodiment, the internal power voltage VDDO may be 1.8V. Referring to FIG. 23, the external high voltage VDDH applied to the pad in a state in which the internal power voltage VDDO is the tenth level V10, for example, 1.8V, increases from 0V to the fifth level V5, for example, 3.3V. Accordingly, the division voltage V_DIV output to the first internal node Ni1 may increase to reach the eighth level V8, that is, about 1.65V level, and the stabilization voltage VSTB may increase from the ninth level V9 (e.g., about 1.6V) and then settles to about 1.94V level. Accordingly, all of the gate-drain voltages $V_{GD}$, the gate-source voltages $V_{GS}$, and the drain-source voltages $V_{DS}$ of the first to third transistors NM1 to NM3 may be less than 1.98V as will be described below in more detail with reference to FIG. 24.

Referring to FIG. 24, gate voltages, drain voltages, and source voltages of the first to third transistors NM1 to NM3 are shown respectively, when the internal power voltage VDDO is the tenth level V10 and the external high voltage VDDH increases from 0V to the fifth level V5. For example, the tenth level V10 may be 1.8V, and the fifth level V5 may be 3.3V. As shown in FIG. 24, when the internal power voltage VDDO is 1.8V and the external high voltage VDDH increases from 0V to 3.3V, all of the gate-drain voltages $V_{GD}$, the gate-source voltages $V_{GS}$, and the drain-source voltages $V_{DS}$ of the first to third transistors NM1 to NM3 may change within a range less than 1.98V. Accordingly, the reliability conditions of the first to third transistors NM1 to NM3 are satisfied.

The embodiments of the present disclosure disclosed in the present specification and drawings are merely to provide specific examples to easily describe the technical content of the present disclosure and to help understanding of the present disclosure, and are not intended to limit the scope of embodiments of the present disclosure. It is apparent to those skilled in the art to which the present disclosure pertains that other modified examples based on the technical spirit of the present disclosure may be implemented in addition to the embodiments disclosed herein.

What is claimed is:
1. An output driving circuit comprising:
   a pull-down driver including first, second, and third transistors connected in series between a pad and a ground node; and
   a voltage stabilizer configured to generate a stabilization voltage based on a voltage of the pad and a power voltage, and output the stabilization voltage to a control terminal of the second transistor,
   wherein, when the voltage of the pad has a first value and the power voltage has a second value less than the first value, the voltage stabilizer divides the voltage of the pad and generates the stabilization voltage based on the divided voltage of the pad, and
   wherein the voltage stabilizer comprises a fourth transistor and a fifth transistor connected in series between the power voltage and a first internal node outputting the divided voltage, the fourth transistor and the fifth transistor being connected at a second internal node, and the voltage stabilizer outputs a voltage of the second internal node as the stabilization voltage.

2. The output driving circuit of claim 1, wherein a value of the stabilization voltage is sufficient to make a difference between a voltage at an end terminal of the second transistor and a voltage at the control terminal of the second transistor equal to or less than a given value.

3. The output driving circuit of claim 1, wherein the second value corresponds to a ground voltage, and a value of the stabilization voltage is less than the first value and greater than the second value.

4. The output driving circuit of claim 3, wherein the first value is greater than 1.8V.

5. The output driving circuit of claim 3, wherein the first value is greater than 1.8V and less than 3.3V.

6. The output driving circuit of claim 1, wherein the voltage stabilizer comprises:
   a voltage divider connected between the pad and a ground, the voltage divider being configured to divide the voltage of the pad and to output the divided voltage to the first internal node; and
   a stabilization voltage generator connected between the power voltage and the first internal node, the stabilization voltage generator being configured to output the stabilization voltage based on the power voltage.

7. The output driving circuit of claim 6, wherein the voltage divider comprises:
   at least one first diode connected between the pad and the first internal node; and
   at least one second diode connected between the first internal node and the ground.

8. The output driving circuit of claim 7, wherein the number of the first diodes and the number of the second diodes are the same.

9. The output driving circuit of claim 7, wherein the voltage divider further comprises a capacitor connected between the first internal node and the ground.

10. The output driving circuit of claim 1, wherein:
   the fourth transistor is adjacent to the power voltage, and the fifth transistor is adjacent to the first internal node;
   the fifth transistor is a PMOS transistor; and
   a gate terminal of the fifth transistor is connected to the power voltage.

11. The output driving circuit of claim 10, wherein the fourth transistor is a PMOS transistor, and a gate terminal of the fourth transistor is connected to the first internal node.

12. The output driving circuit of claim 10, wherein the stabilization voltage generator further comprises a sixth transistor connected between the power voltage and the second internal node.

13. The output driving circuit of claim 12, wherein the sixth transistor is an NMOS transistor, and a gate terminal of the sixth transistor is connected to the power voltage.

14. The output driving circuit of claim 10, wherein the fourth transistor is an NMOS transistor, and a gate terminal of the fourth transistor is connected to the power voltage.

15. The output driving circuit of claim 1, wherein, when the power voltage has a third value greater than the second value and less than the first value, the voltage stabilizer outputs the power voltage as the stabilization voltage.

16. The output driving circuit of claim 15, wherein the third value of the power voltage is less than 1.98V.

17. The output driving circuit of claim 1, further comprising:
   an input/output control logic configured to receive a clock signal and an enable signal and output a first control signal to the third transistor; and
   a gate control logic configured to receive the voltage of the pad and output a feedback voltage to a gate terminal of the first transistor.

18. The output driving circuit of claim 17, further comprising:
   an inverter configured to invert the enable signal and output the inverted enable signal to the gate control logic; and
   an internal resistor having a first end connected to the pad and a second end connected to the gate control logic.

19. The output driving circuit of claim 18, wherein the first, second, and third transistors included in the pull-down driver are NMOS transistors.

* * * * *